(12) United States Patent
Korenaga

(10) Patent No.: US 6,946,757 B2
(45) Date of Patent: Sep. 20, 2005

(54) STAGE APPARATUS AND METHOD OF CONTROLLING THE SAME

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/716,702

(22) Filed: Nov. 20, 2003

(65) Prior Publication Data

US 2004/0100153 A1 May 27, 2004

(30) Foreign Application Priority Data

Nov. 22, 2002 (JP) ........................................ 2002-339750

(51) Int. Cl.$^7$ ............................................. H02K 41/00
(52) U.S. Cl. .......................................... 310/12; 310/90.5
(58) Field of Search .......................... 310/12–39, 90.5; 318/135

(56) References Cited

U.S. PATENT DOCUMENTS

| | | | | |
|---|---|---|---|---|
| 4,013,906 A | * | 3/1977 | Eastham | 310/13 |
| 4,667,139 A | * | 5/1987 | Hirai et al. | 318/687 |
| 5,264,982 A | * | 11/1993 | Cox et al. | 361/144 |
| 5,467,720 A | | 11/1995 | Korenaga et al. | 108/20 |
| 5,518,550 A | | 5/1996 | Korenaga et al. | 118/729 |
| 5,684,856 A | | 11/1997 | Itoh et al. | 378/34 |
| 5,780,943 A | * | 7/1998 | Ono | 310/12 |
| 5,841,250 A | | 11/1998 | Korenage et al. | 318/135 |
| 6,002,465 A | | 12/1999 | Korenaga | 355/53 |
| 6,037,680 A | | 3/2000 | Korenaga et al. | 310/12 |
| 6,107,703 A | | 8/2000 | Korenaga | 310/12 |
| 6,128,069 A | | 10/2000 | Korenaga | 355/53 |
| 6,157,159 A | | 12/2000 | Korenaga et al. | 318/649 |
| 6,177,978 B1 | | 1/2001 | Korenaga | 355/53 |
| 6,255,795 B1 | * | 7/2001 | Ebihara et al. | 318/649 |
| 6,265,793 B1 | | 7/2001 | Korenaga | 310/12 |
| 6,271,606 B1 | * | 8/2001 | Hazelton | 310/12 |
| 6,320,645 B1 | | 11/2001 | Inoue et al. | 355/53 |
| 6,353,271 B1 | | 3/2002 | Williams | 310/12 |
| 6,359,677 B2 | | 3/2002 | Itoh et al. | 355/53 |
| 6,414,742 B1 | | 7/2002 | Korenaga et al. | 355/53 |
| 6,479,991 B1 | | 11/2002 | Korenaga | 324/226 |
| 6,570,645 B2 | | 5/2003 | Korenaga et al. | 355/75 |
| 2002/0145721 A1 | | 10/2002 | Korenaga et al. | 355/75 |
| 2003/0007140 A1 | | 1/2003 | Korenaga | 355/72 |
| 2003/0098966 A1 | | 5/2003 | Korenaga et al. | 355/75 |
| 2003/0102723 A1 | | 6/2003 | Korenaga | 310/12 |

FOREIGN PATENT DOCUMENTS

JP 2000-106344 4/2000

* cited by examiner

Primary Examiner—Dang Le
(74) Attorney, Agent, or Firm—Fitzpatrick, Cella, Harper & Scinto

(57) ABSTRACT

A stage apparatus includes a first-direction guide which extends in a first direction and can move in a second direction perpendicular to the first direction, a first driving mechanism which moves the first-direction guide in the second direction, a movable body which can be guided by the first-direction guide to move in the first direction, and a first electromagnetic force generating device which generates an electromagnetic force in the second direction between the movable body and the first-direction guide in synchronism with acceleration of the first-direction guide in the second direction, so as to keep the movable body and the first-direction guide in noncontact with each other.

11 Claims, 19 Drawing Sheets

A-A SECTIONAL VIEW

FORCE ACTING ON X-Y SLIDER AND FINE MOVEMENT STAGE

FORCE ACTING ON Y BAR

CURRENTS APPLIED TO ELECTROMAGNETS 101a AND 101b

TIME

CURRENTS APPLIED TO ELECTROMAGNETS 101c AND 101d

TIME

DRIVING OF SLIDER 302

TIME

STAGE APPARATUS AND METHOD OF CONTROLLING THE SAME

FIELD OF THE INVENTION

The present invention relates to a movable stage apparatus and a method of controlling the same. More particularly, the present invention relates to a movable stage apparatus suitable for a wafer stage, or the like, in an exposure apparatus, and a method of controlling the same.

BACKGROUND OF THE INVENTION

As the accuracy of an exposure apparatus increases, a movable stage apparatus loaded with a six-axis fine movement stage as a wafer stage has been employed. A stage apparatus of this type is disclosed in, e.g., Japanese Patent Laid Open No. 2000-106344. A general stage apparatus will be described below with reference to FIGS. 15 to 18.

FIG. 15 is a view schematically showing a general movement stage apparatus. A yaw guide 301 is formed on a stage surface plate 300, and a Y slider 302 guided by the yaw guide 301 and the stage surface plate 300 is formed. Air pads (not shown) are provided between the Y slider 302 and stage surface plate 300, and between the Y slider 302 and yaw guide 301. Accordingly, the Y slider 302 can slide in the Y direction.

An X slider 303 is formed to surround the Y slider 302. The X slider 303 is formed of an X upper plate 303a, X side plates 303b, and an X lower plate 303c, and is guided by the side surfaces of the Y slider 302. Air pads 380 are provided between the side surfaces of the Y slider 302 and the X side plates 303b. FIG. 18 shows this arrangement. An air pad (not shown) is provided also between the X lower plate 303c of the X slider 303 and the stage surface plate 300. Accordingly, the X slider 303 can slide in the X direction with respect to the Y slider 302. The Y slider 302 is slidable in the Y direction, as described above, and the X slider 303 is slidable in the X direction with respect to the Y slider 302. Hence, the X slider 303 can slide in the X-Y direction.

A fine movement stage 360 constituted by a six-axis fine movement linear motor and a fine movement top plate 361 is formed on the X upper plate 303a of the X slider 303. As shown in FIG. 16, the six-axis fine movement linear motor is constituted by two X fine movement linear motors 362, two Y fine movement linear motors 363, and three Z fine movement linear motors 364. Each fine movement linear motor is a linear motor which is formed of a hollow, elliptical, flat coil, and magnets and yokes sandwiching the flat coil from the two sides, and which utilizes a so-called Lorentz force. This linear motor generates a thrust in a direction perpendicular to the straight portion of the elliptical coil within a plane including the flat surface of the flat, elliptical coil. The flat surface of the elliptical coil of each X fine movement linear motor 362 is parallel to the X-Z plane and its straight portion is parallel to the Z axis. The flat surface of the elliptical coil (Y coil 363d) of each Y fine movement linear motor 363 is parallel to the Y-Z plane and its straight portion is parallel to the Z axis. The flat surface of the elliptical coil (Z coil 364d) of each Z fine movement linear motor 364 is parallel to the Y-Z plane and its straight portion is parallel to the Y axis. Thus, the elliptical coils of the X, Y, and Z fine movement linear motors 362, 363, and 364 generate forces in the X, Y, and Z directions, respectively. Thus, the six-axis fine movement stage 360 can drive in six directions, i.e., in the X, Y, and Z axis directions and about the X, Y, and Z axes.

Arrangements other than that described above are also possible. For example, the number of either the X or Y fine linear motor may be one.

In each fine movement linear motor, the coil (363d, 364d) is fixed to the X slider X upper plate 303a through a coil frame (363e, 364e), and a magnet (363c, 364c) and a yoke (363b, 364b) are fixed to the fine movement top plate 361 through a yoke fixing member (363a, 364a).

Linear motors (an X linear motor 320 and Y linear motors 340) are also used to drive the X slider 303 and Y slider 302, respectively. The Y linear motors 340 are connected to the Y slider 302 through wing plates 304. Each linear motor 340 for driving the Y slider 302 is of a stationary coil, moving magnet type, as shown in FIG. 17, which is a two-phase sine wave drive type linear motor which realizes long stroke driving by selecting two coils in accordance with the magnet positions and appropriately controlling the magnitudes and directions of currents. The stationary coil is formed of a coil frame 342 fixed to the stage surface plate 300 through legs 341, and coils 343 fixed to the coil frame 342. The moving magnet is formed of a pair of four-pole magnets 344 sandwiching the coils 343 from two sides, yokes 346 formed on the rear surfaces of the four-pole magnets 344, and movable element side plates 345, which connect the yokes 346. Each X linear motor has a similar arrangement to this.

The positions of the Y slider, X slider, and fine movement top plate are measured by sensors (not shown). Desirably, the Y slider 302 and X slider 303 are measured by laser interferometers each having at least one axis, and the fine movement top plate 361 is measured by a laser interferometer having at least six axes.

In the above arrangement, the X slider 303 is driven by the linear motor shown in FIG. 18 to move through a long distance in both the X and Y directions, and the fine movement top plate 361 is controlled at high accuracy by the six-axis fine movement linear motor shown in FIG. 16. The six-axis fine movement linear motor for controlling the fine movement top plate 361 utilizes the Lorentz force. Thus, even when the positions of the X and Y sliders 303 and 302 and of the fine movement top plate 361 change, the six-axis fine movement linear motor is not influenced by this change at all, so that high accuracy position control can be performed.

An exposure apparatus stage loaded with the six-axis fine movement stage 360 utilizing the Lorentz force on the X-Y stage in the above manner is advantageous in that it can perform high accuracy position control over a long stroke. However, as the six-axis fine movement stage 360 is loaded, the mass of the portion ahead of the X slider 303, i.e., the total mass of the X slider 303 and fine movement stage 360 increases. The exposure apparatus stage must be accelerated at a high acceleration in order to increase the productivity. When the total mass of the X slider 303 and fine movement stage 360 increases, even when the acceleration stays the same, the force necessary for acceleration increases in proportion to the mass.

In the arrangement of the stage apparatus described above, the force necessary for accelerating the X slider 303 and fine movement stage 360 in the Y direction is originally generated by the Y linear motors 340 shown in FIG. 17. Part of the generated force is transmitted to the X slider 303 and fine movement stage 360 through the air pads shown in FIG. 18. More specifically, the two Y linear motors each having the arrangement as shown in FIG. 17 generate a force of $(m_1+m_2+m_3) \times \alpha$ where $m_1$, is the mass of the Y slider system, $m_2$ is the mass of the X slider system, $m_3$ is the mass of the fine movement top plate system, and α is the acceleration. Of the generated force, a force of $(m_2+m_3) \times \alpha$ is transmitted to the X slider 303 and fine movement stage 360 through the air pads 380 shown in FIG. 18.

What matters is the force transmission ability of the air pads 380. Force transmission with the air pads 380 is suppressed to about 1 kgf/cm² when converted into a pressure. Hence, by adding the fine movement stage, if the force of $(m_2+m_3) \times \alpha$ increases, the air pads 380 can no longer transmit this force. Still, it is very difficult to form a rolling type stage with the air pads 380, due to the issues of the service life and dust. A rolling type guide is difficult to apply to a stage that must operate continuously over a long period of time and must have a high cleanliness as in an exposure apparatus. Hence, to form a noncontact guide cannot be given way.

In addition, recently, to expose a finer pattern, a stage that can be used in a vacuum atmosphere is required. To form air pads in a vacuum atmosphere, a means for collecting air must be provided in the periphery of the air pads. As this peripheral portion does not contribute to thrust transmission, the thrust transmission ability converted into the pressure tends to decrease more and more.

In view of the above situation, it is demanded to provide a stage apparatus which has a noncontact guide that can quickly accelerate a movable body loaded with a fine movement stage and having a large conveying mass.

SUMMARY OF THE INVENTION

According to one aspect of the present invention, there is provided a stage apparatus comprising: a first direction guide which extends in a first direction and can move in a second direction perpendicular to the first direction; a first driving mechanism which moves the first direction guide in the second direction; a movable body which can be guided by the first direction guide to move in the first direction; and first electromagnetic force generating means which generates an electromagnetic force in the second direction between the movable body and the first direction guide to keep the movable body and the first direction guide in noncontact with each other.

Furthermore, according to another aspect of the present invention, there is provided a method of controlling a stage apparatus, comprising: a driving step of moving a first direction guide, which extends in a first direction and can move in a second direction perpendicular to the first direction, in the second direction; a first control step of controlling at least a pair of electromagnets, which generate electromagnetic forces in opposite directions along the second direction between a movable body, which can be guided in the first direction guide to move in the first direction, and the first direction guide, to keep the movable body and the first direction guide in noncontact with each other; and a second control step of controlling driving of the electromagnets, in response to movement of the first direction guide in the second direction by the driving step, to apply an accelerating force in the second direction to the movable body.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 19A to 19D are views for explaining electromagnet control of the first embodiment, in which FIGS. 19B to 19D are timing charts.

DETAILED DESCRIPTION OF THE PREFERRED EMBODIMENTS

Preferred embodiments of the present invention will now be described in detail in accordance with the accompanying drawings.

<First Embodiment>

Figure 1:
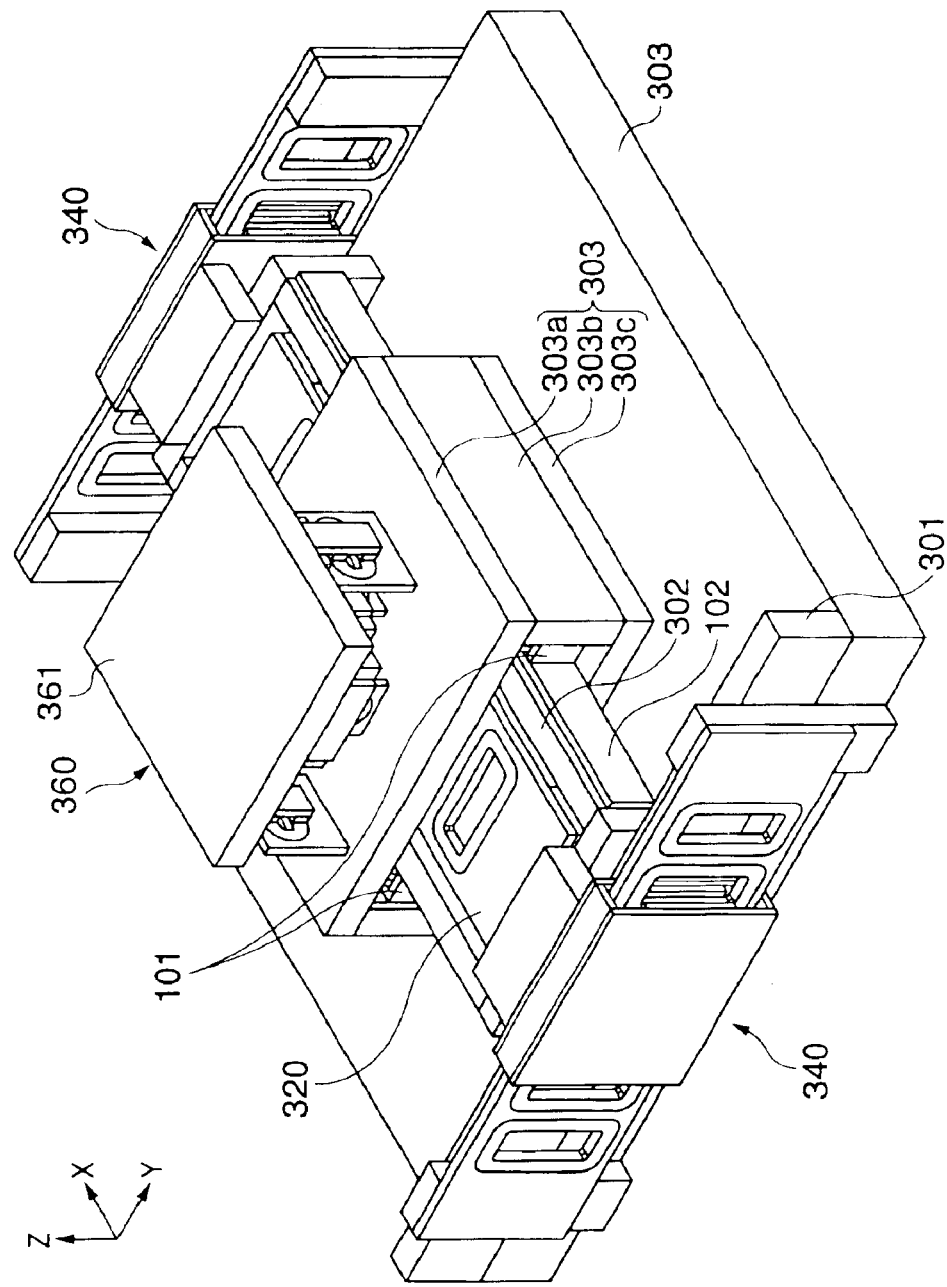
FIG. 1 is a view schematically showing a movement stage apparatus according to the first embodiment.
Figure 15:
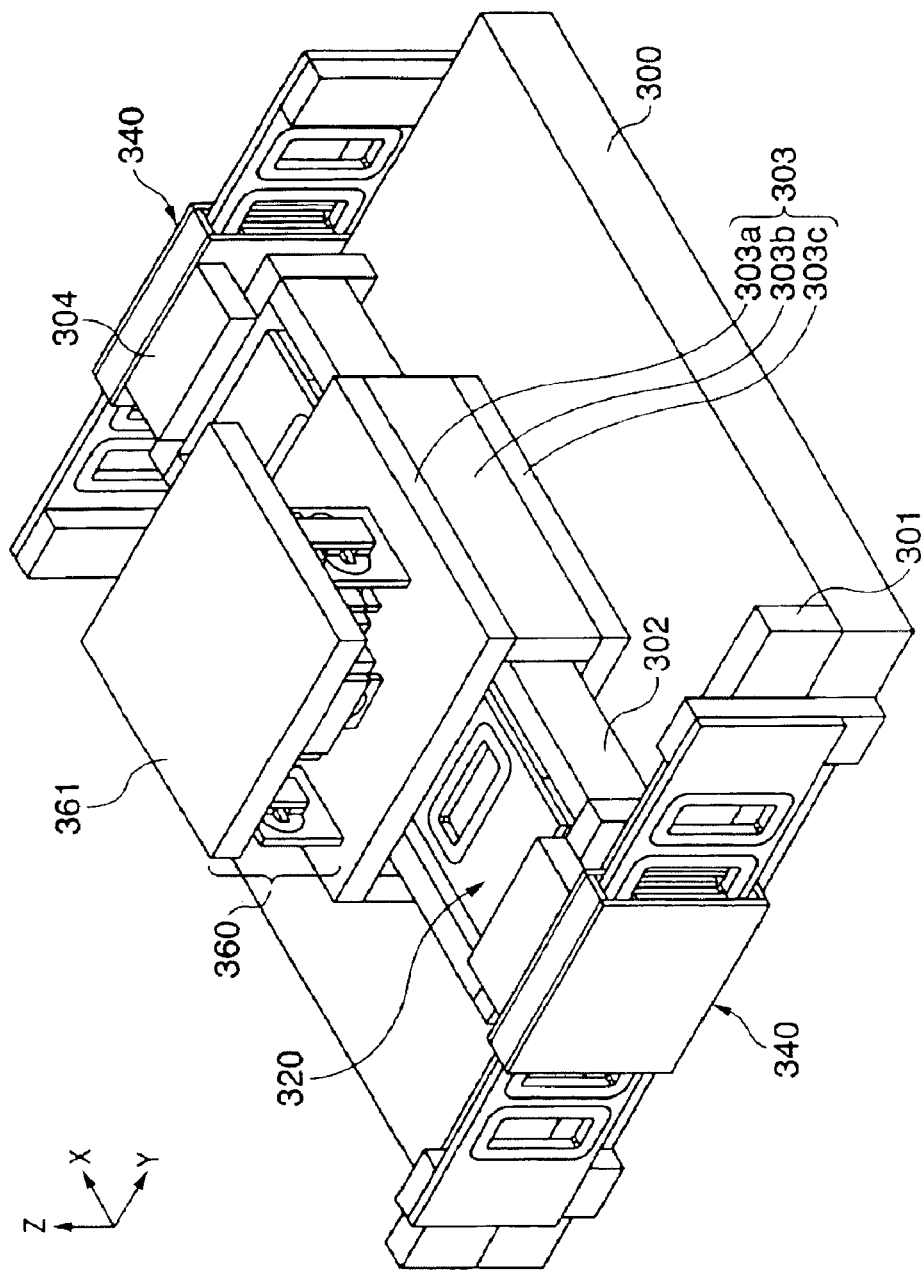
FIG. 15 is a view schematically showing a general movement stage apparatus.
Figure 16:
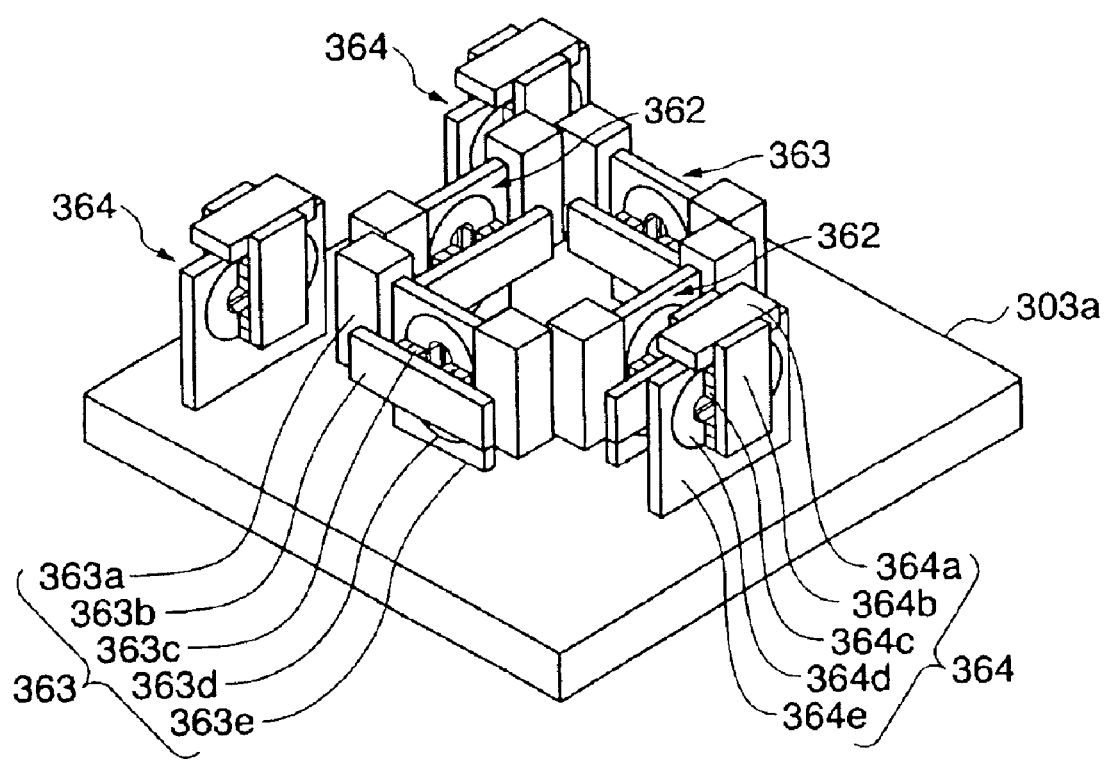
FIG. 16 is a view for explaining the arrangement of a six-axis fine movement linear motor in the fine movement stage.
Figure 17:
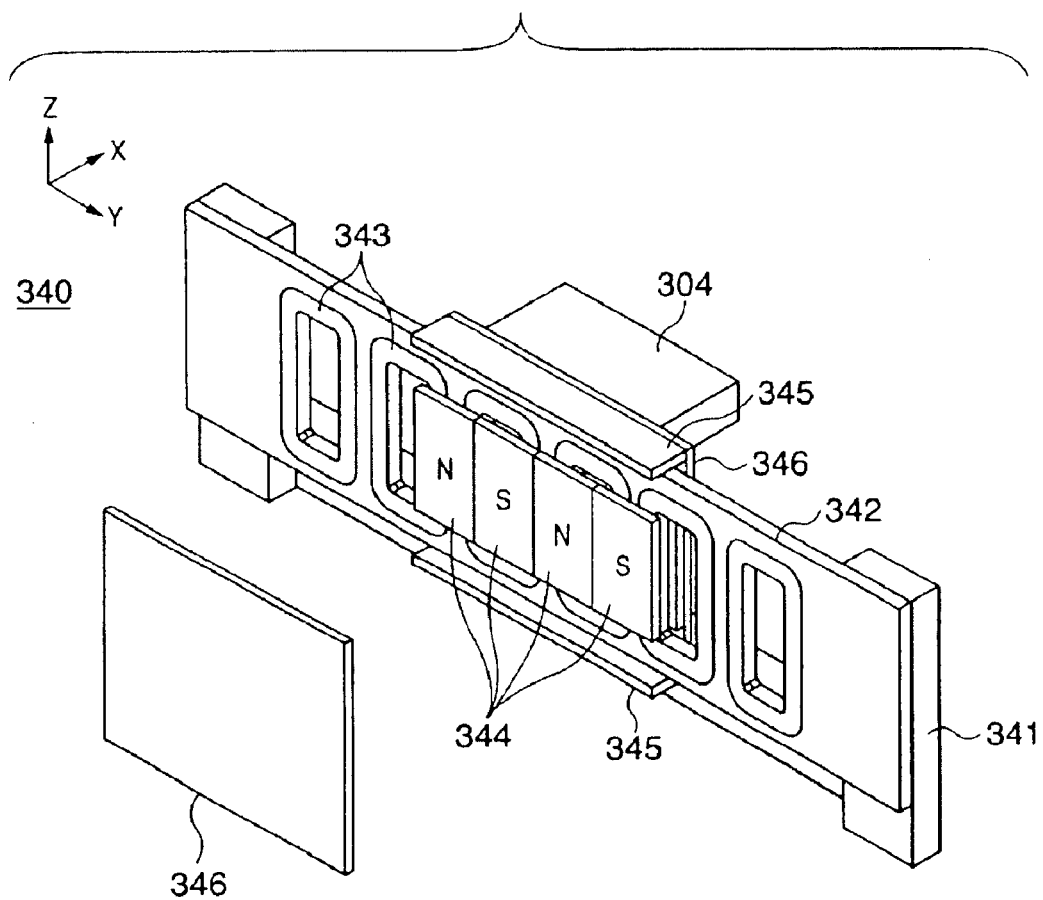
FIG. 17 is a view for explaining the arrangement of a coarse linear motor which drives a Y slider.

FIG. 1 is a view schematically showing a stage apparatus according to the first embodiment. The basic arrangement of the stage is the same as that described above with reference to FIG. 15. More specifically, the stage apparatus has a stage surface plate 300, a Y slider 302, Y linear motors 340, an X slider 303, an X linear motor 320, a fine movement stage 360 including a six-axis fine movement linear motor and a fine movement top plate 361, and the like. The Y slider 302 is guided in the Y direction by the stage surface plate 300 and a yaw guide 301 through an air pad. An air pad is provided between the X slider 303 and stage surface plate 300. In the following embodiments, the fine movement stage 360 can be driven in six-axis directions, but the present invention is not limited to this. Note that the fine movement stage 360 must be able to move finely at least in the moving direction of the X slider 303.

The stage apparatus of the first embodiment is characterized in the arrangement of the guide that guides the X slider 303 in the X direction. In a general stage apparatus, as described in FIG. 15, the X slider 303 is guided by the air pads provided between the side surfaces of the Y slider 302 and the X side plates 303b of the X slider 303 such that it moves along the side surfaces of the Y slider 302.

Figure 2:
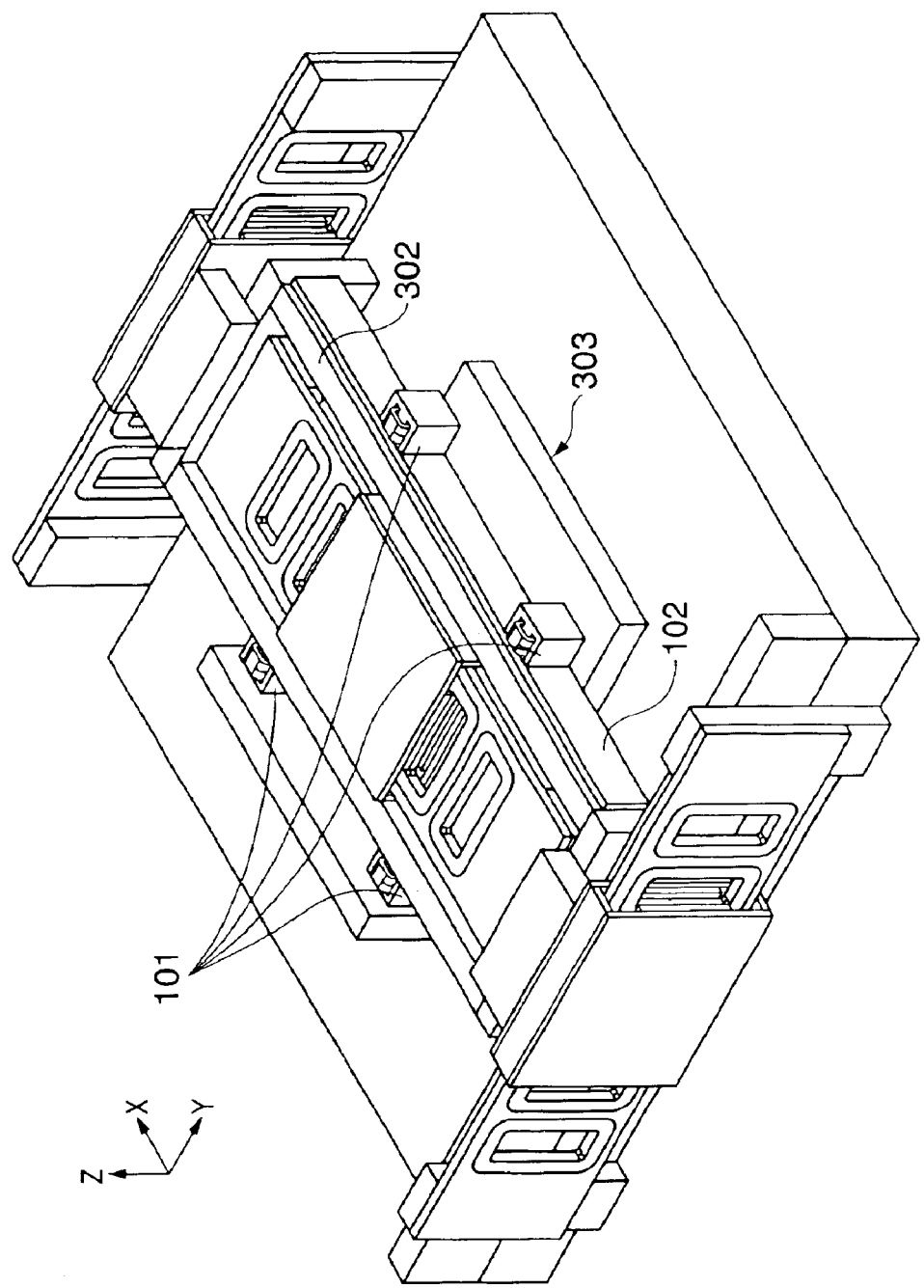
FIG. 2 is a partly omitted view of the movement stage apparatus according to the first embodiment.
Figure 3:
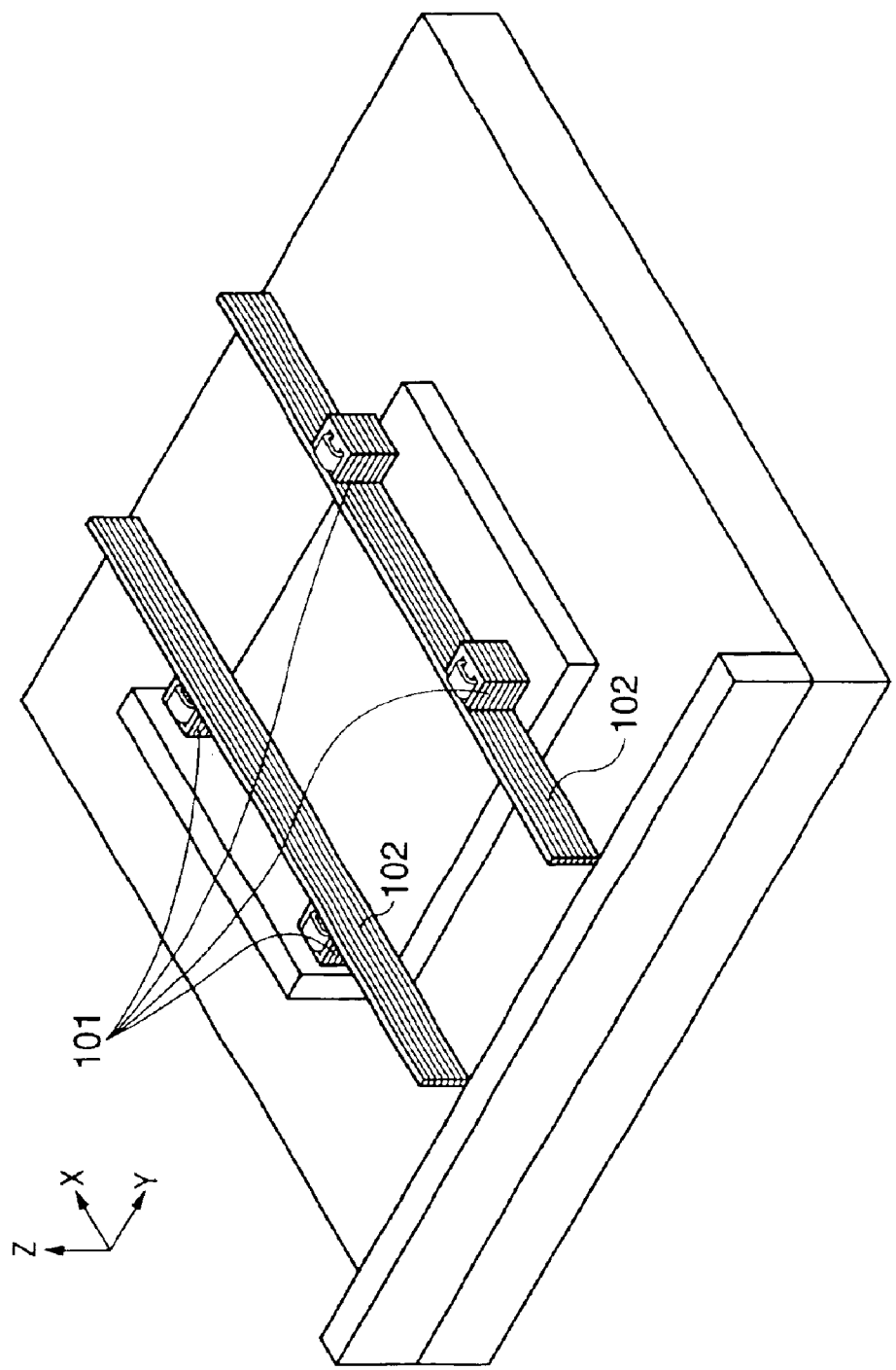
FIG. 3 is a detailed view of a portion around electromagnets in the movement stage apparatus according to the first embodiment.

In contrast to this, in the first embodiment, as shown in FIGS. 2 and 3 as well, the X slider 303 is guided by four Y electromagnets 101 and two Y attracting plates 102 formed between the side surfaces of the Y slider 302 and side plates 303b of the X slider 303 such that it moves along the side surfaces of the Y slider 302. The two Y attracting plates 102 are respectively fixed to the two side surfaces of the Y slider 302, and the four Y electromagnets 101 are fixed in two to each of the two X side plates 303b. Each of the Y attracting plates 102 and the corresponding two Y electromagnets 101 oppose each other in a noncontact manner. The Y attracting plates 102 and Y electromagnets 101 are preferably formed of multilayered magnetic bodies, as shown in FIG. 3, because this can minimize the adverse effect of the eddy current caused by a change in magnetic flux of the electromagnets. Each Y electromagnet 101 is formed by winding a coil on the teeth at the center of a core having an E shaped section.

As the electromagnet generates only an attracting force, to generate forces in positive and negative directions of the Y axis, a pair of opposing electromagnets are required. In FIG. 3, a total of four, i.e., two pairs of Y electromagnets 101 are provided such that they can generate forces and moments in the positive and negative directions of the Y axis and in the positive and negative rotational directions about the Z axis.

The measurement system of the X slider 303 will be described next. In the stage apparatus described with reference to FIG. 15, the X slider 303 suffices as far as at least its position in the X axis direction is measured. In contrast to this, in this embodiment, the X slider 303 must be measured regarding its three positions, i.e., the position in the X axis direction, the position in the Y axis direction, and rotation about the Z axis. In the stage apparatus of FIG. 15, the position in the Y axis direction and rotation about the Z axis need not be measured as they are mechanically regulated by the air pads. In the stage apparatus of this embodiment, however, the position in the Y axis direction and rotation about the Z axis are not mechanically retrained, but are controlled by the Y electromagnets 101. Therefore, the position in the Y axis direction and rotation about the Z axis of the X slider 303 must be measured.

Figure 4:
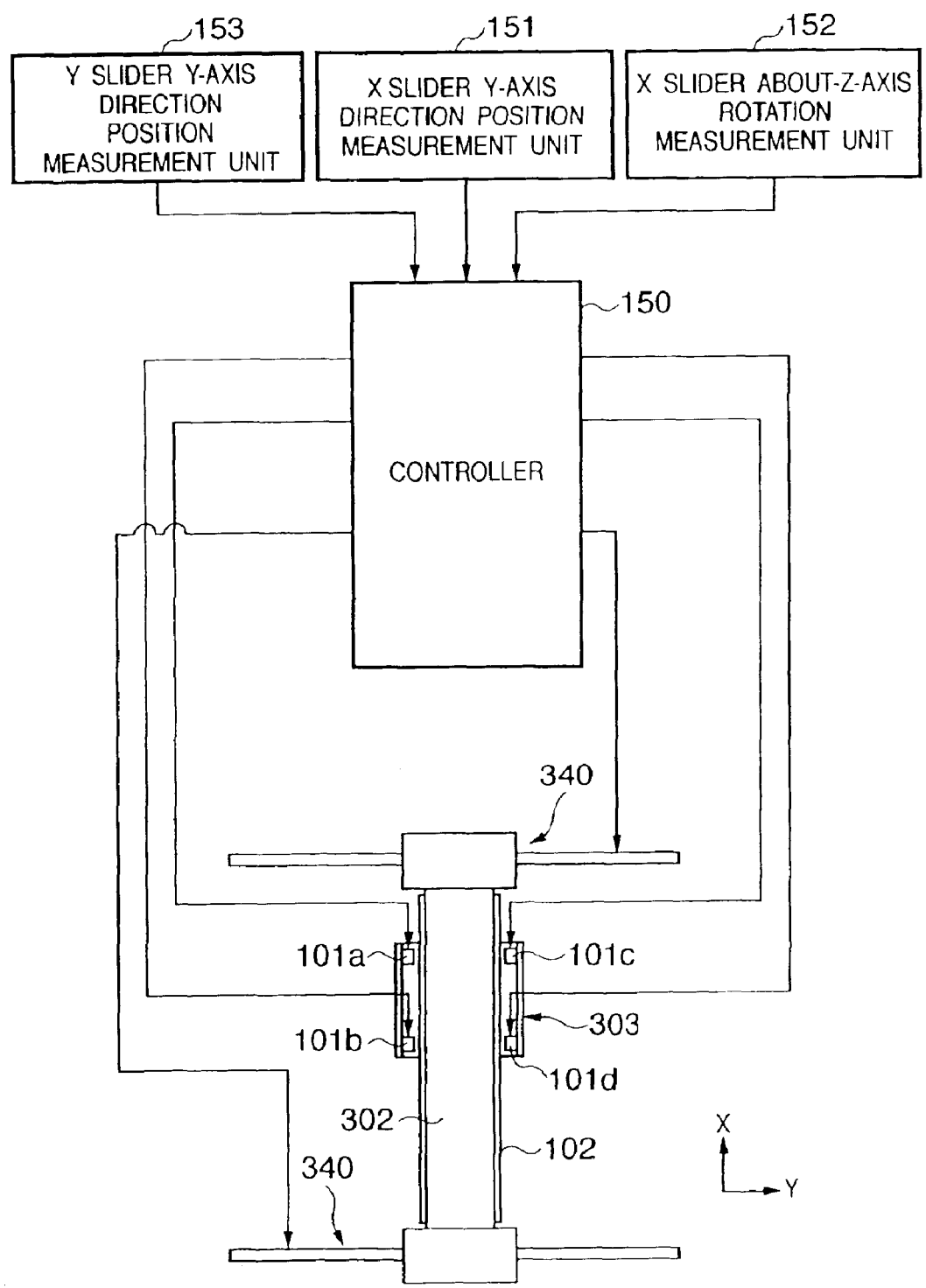
FIG. 4 is a view for explaining electromagnet control according to the first embodiment.

Control and operation of the Y electromagnets in the above arrangement will be described. FIG. 4 is a view schematically showing how the Y electromagnet is controlled by a controller 150.

The Y electromagnets 101 provided to the X slider 303 and the measurement system of the X slider 303 have two roles. The first role is to keep the X slider 303 and Y slider 302 in noncontact with each other. The second role is to transmit a large accelerating force in the Y axis direction from the Y slider 302 to the X slider 303.

The first role described above is realized by measuring the position in the Y axis direction and the rotation amount about the Z axis of the X slider 303 and the position in the Y axis direction and the rotation amount about the Z axis of the Y slider 302, and supplying appropriate currents to the four Y electromagnets 101 such that the Y slider 302 and X slider 303 do not come into contact with each other. More specifically, the controller 150 supplies appropriate currents to four Y electromagnets 101a to 101d on the basis of the measurement information from an X slider X axis direction position measurement unit 151, X slider about Z axis rotation measurement unit 152, and Y slider Y axis direction position measurement unit 153, and Y slider about-Z-axis rotation measurement unit (not shown), such that the Y slider 302 and X slider 303 do not come into contact with each other. The X slider 303 suffices as far as it is so controlled as to be in noncontact with the Y slider 302, and need not follow the Y slider 302 at high accuracy. In other words, the X slider 303 is not controlled to follow the Y slider 302. In this example, the position in the Y-axis and/or the rotation amount about the Z-axis of the X-slider 303, and the position in the Y-axis and/or the rotation amount about the Z-axis of the Y-slider 302 are measured. While performing such measuring, the controller 150 controls the X slider 303 and the Y slider 302 independently by giving Y position commands and rotation amount in Z-axis commands to the X slider 303 and Y slider 302 so that the contact of the X slider 303 and Y slider 302 is avoided. Thus, a vibration which propagates to the X slider 303 through the Y slider 302 is suppressed and position precision of X slider 303 is enhanced. This control can be achieved by a known technique with a rotary magnetic bearing, or the like.

The second role described above can be achieved by causing two of the four Y electromagnets to generate a force necessary for accelerating the X slider and fine movement stage in synchronism with acceleration in the Y axis direction. For example, in FIG. 2, for acceleration in the positive Y axis direction, the two deep side Y electromagnets (101a and 101b of FIG. 4) of FIG. 2 may generate a force necessary for accelerating the X slider 303 and fine movement stage in synchronism with acceleration in the Y axis direction. Then, the X slider 303 can receive an attracting force in the positive Y axis direction from the Y slider 302. Conversely, to accelerate the X slider 303 in the negative Y axis direction, the two front side Y electromagnets (101c and 101d of FIG. 4) of FIG. 2 may generate a force necessary for accelerating the X slider and fine movement stage in the Y axis direction in synchronism with acceleration in the Y axis direction. Then, the X slider 303 can receive an attracting force in the negative Y axis direction from the Y slider 302.

The acceleration schedule, i.e., the relationship between the time and acceleration, of the Y slider 302, is known in advance. Therefore, the controller 150 may cause the two of the four Y electromagnets to generate the attracting force for acceleration in the feed forward manner. A control operation for keeping the X slider 303 and Y slider 302 in noncontact with each other is performed during acceleration in the Y direction as well, and the respective Y electromagnets are so controlled as to generate the attracting force for acceleration and a control force for control operation.

Figure 19A:
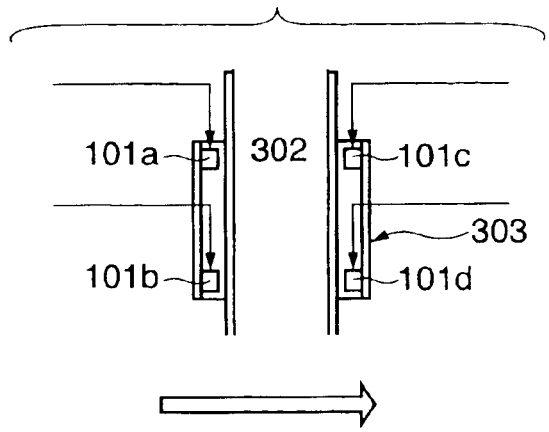
Figure 19B:
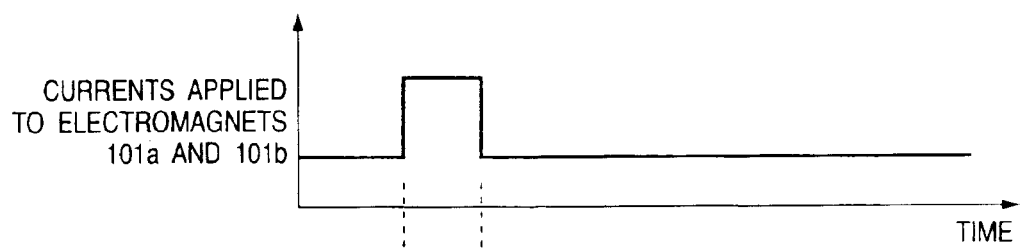
Figure 19C:
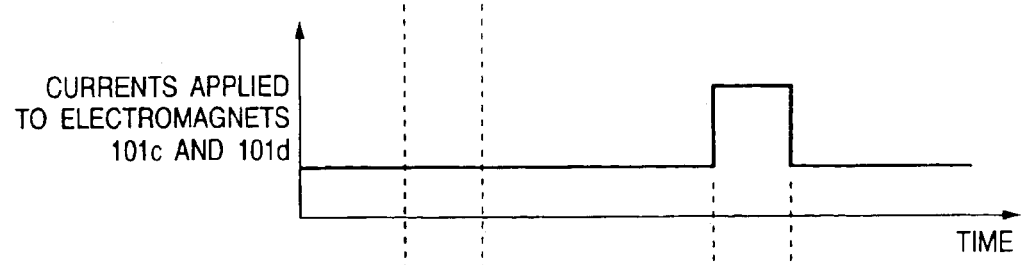
Figure 19D:
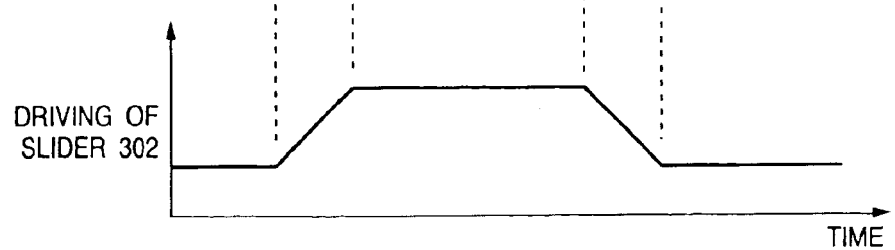

FIGS. 19A to 19D show an example of the control of the electromagnets. The driving timing of the Y slider 302 for moving the Y slider 302 in the direction of the arrows shown in FIG. 19A is as shown in FIG. 19D. In FIG. 19D, the acceleration period of the Y slider 302 is indicated by oblique lines. During this acceleration period, the electromagnetic force generated by the Y electromagnets 101a to 101d is utilized to maintain the noncontact state of the X slider 303 and Y slider 302. Accordingly, when starting the Y slider 302 in the direction of the arrows, currents to the Y electromagnets 101a and 101b are increased, as shown in FIG. 19B, and the resultant attracting force is utilized to cause the X slider 303 to follow the motion of the Y slider 302. When the Y slider 302 reaches a constant speed, current application to the Y electromagnets 101a to 101d is set to be the same as in stopping the Y slider 302, and the noncontact state is maintained. When stopping the Y slider 302, the currents to the Y electromagnets 101c to 101d are increased, as shown in FIG. 19C, and the resultant attracting force is utilized to cause the X slider 303 to follow the stopping operation of the Y slider 302.

When the accelerating force in the Y direction is transmitted by the electromagnets in this manner, the transmission force can be remarkably increased when compared to a case wherein the transmission force is transmitted through air pads. As described above, the force per unit area that can be generated by the air pad is about 1 kgf/cm². In contrast to this, the force per unit area that can be generated by the electromagnet is about 8 kgf/cm², which is about eight times. This can be estimated by the following equation.

When the opposing area of the electromagnet and the attracting plate is A [m²] and a uniform magnetic flux density B [T] is generated in the opposing area, an attracting force F of the electromagnet is:

$$F = \frac{1}{2\mu_0} \times B \times B \times A$$

where $\mu_0$ is the magnetic permeability in the vacuum.

Thus, the force per unit area is:

$$\frac{F}{A} = \frac{1}{2\mu_0} \times B \times B.$$

When the gap between the electromagnet and the attracting plate is appropriately set and a silicon steel plate is used as the material of the electromagnet and attracting force, B can be about 1.4T at maximum. Then, $$\frac{F}{A} = \frac{1}{2(4\pi e^{-7})} \times B \times B = 7.8e^5 \ [N/m^2] \cong 8 \ kgf/cm^2.$$

As described above, when the guide means between the Y slider and X slider is formed of electromagnets, the thrust that can be transmitted can be remarkably increased when compared to a case wherein the guide means is formed of an air pad. As a result, a large acceleration can be obtained even with an X-Y stage on which a six-axis fine movement stage that tends to increase the transport mass is loaded, and accordingly, both high accuracy and high productivity can be obtained.

<Second Embodiment>

Figure 5:
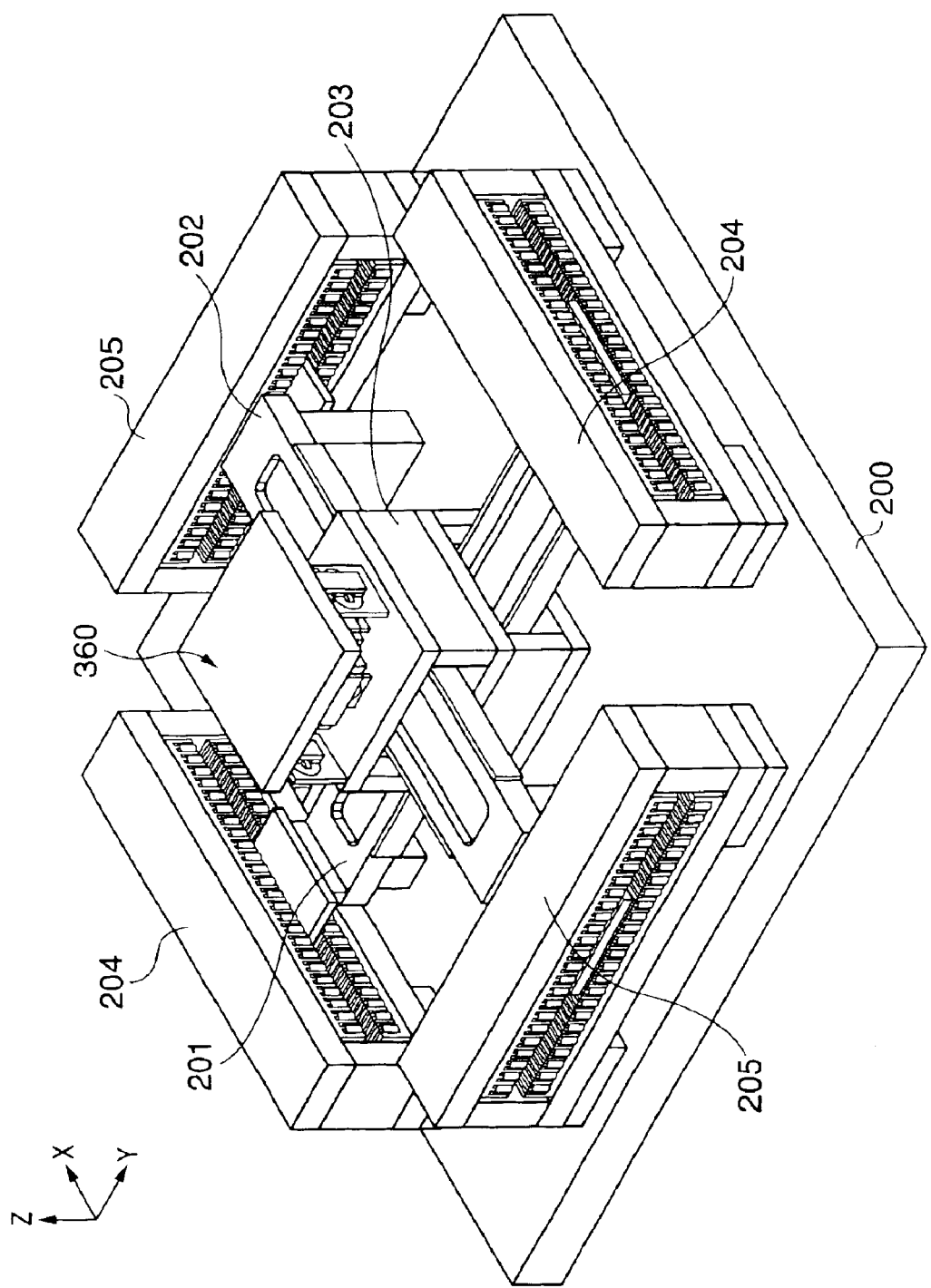
FIG. 5 is a view schematically showing a movement stage apparatus according to the second embodiment.

The second embodiment will be described with reference to FIGS. 5 to 8C. The stage apparatus shown in FIG. 5 is a stage in a 2×2 matrix. In the second embodiment, electromagnets as those described in the first embodiment are provided to the X and Y guide portions of this stage.

As shown in FIG. 5, an X slider 201 and a Y slider 202 are mounted on a stage surface plate 200. Air pads (not shown) are provided under the X slider 201 and the Y slider 202, so that the X slider 201 and the Y slider 202 can slide on the stage surface plate 200.

The X slider 201 and the Y slider 202 are arranged such that they are substantially perpendicular to each other with their Z direction positions being shifted. An X-Y slider 203 is arranged at a position corresponding to the intersection of the X slider 201 and the Y slider 202. An air pad (not shown) is provided under the X-Y slider 203 as well, so that the X-Y slider 203 can slide on the stage surface plate 200. A fine movement stage 360 similar to that of the first embodiment is formed on the X-Y slider 203, to enable very high accuracy position control.

Figure 6:
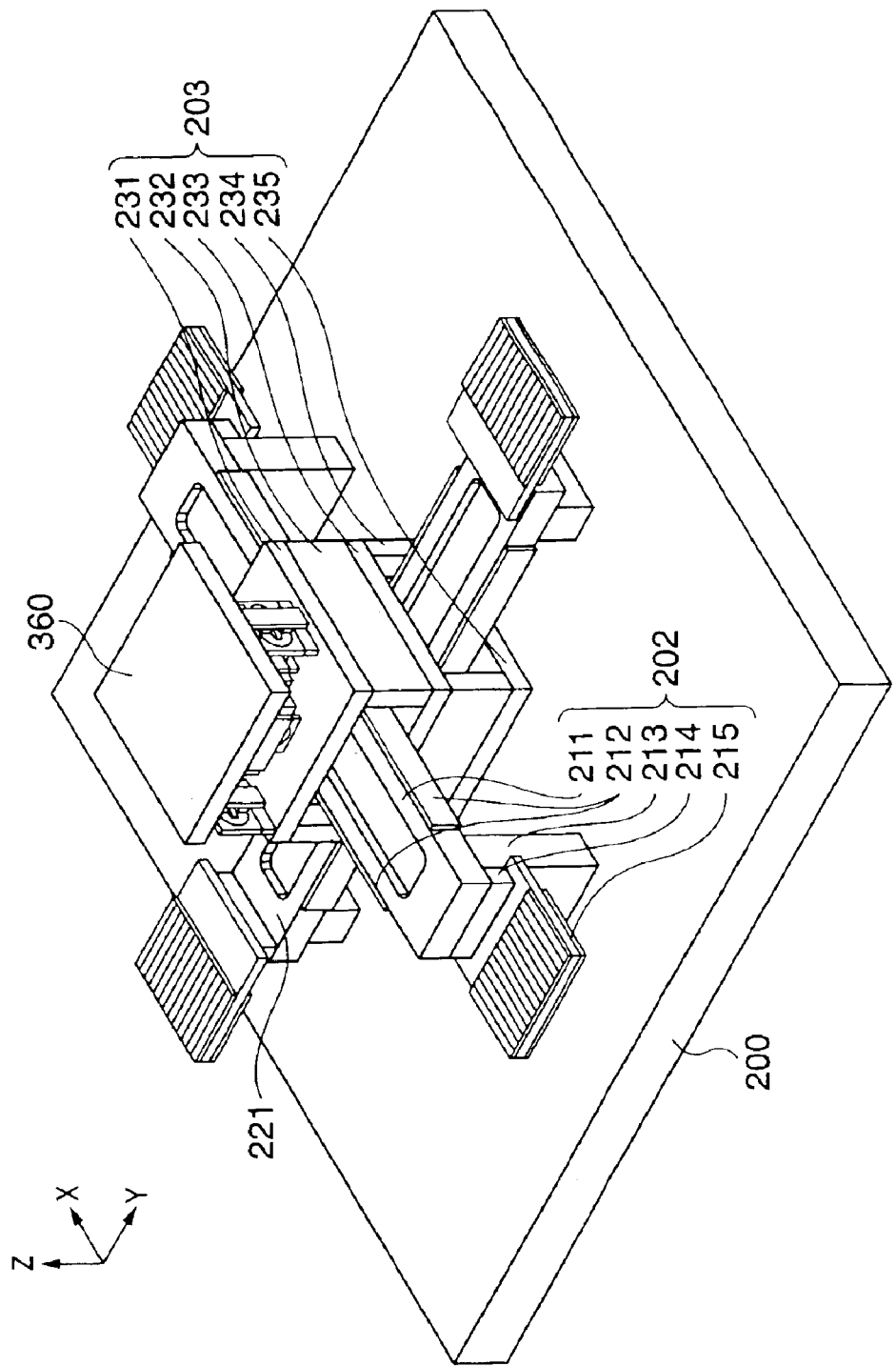
FIG. 6 is a partly omitted view of the movement stage apparatus according to the second embodiment.

Iron core linear motors (X linear motors 204 and Y linear motors 205) having the structure shown in FIG. 6 are formed on the two sides of each of the X slider 201 and the Y slider 202. Thus, large accelerating forces can be applied to the X slider 201 and the Y slider 202.

The details of the Y slider 202 are as follows. The Y slider 202 is formed of a Y bar 211, Y attracting plates 212 formed on the two side surfaces of the Y bar 211, Y legs 213 formed at the two ends of the Y bar 211, and Y linear motor movable elements 215 formed at the two ends of the Y bar 211 through Y linear motor movable element attaching plates. A holding force acts on each Y linear motor movable element 215 to fall at substantially the center of a Y linear motor stator 240 (FIGS. 8A to 8C) because of the attracting force of the Y linear motor stator 240. Thus, the position of the Y slider 202 in the X direction does not shift largely. The air pads (not shown) described above are provided between the Y legs 213 and stage surface plate 200.

The X slider 201 and Y slider 202 have the same arrangement except for a difference in height. The X slider 201 is arranged as follows: its X bar 221 is substantially perpendicular to the Y bar 211, and hence, the entire X slider 201 is substantially perpendicular to the Y slider 202, as described above. The X-Y slider 203 is formed at the intersection of the X slider 201 and the Y slider 202.

As shown in FIG. 6, the X-Y slider 203 is formed of an X-Y upper plate 231, two Y driving plates 232 provided to face the two side surfaces of the Y bar 211, an X-Y middle plate 233, two X driving plates 234 provided to face the two side surfaces of the X bar 221, an X-Y lower plate 235, a total of four Y electromagnets, not shown in FIGS. 5 and 6, provided in two to each of the two Y driving plates 232, and a total of four electromagnets, not shown in FIGS. 5 and 6, provided in two to each of the two X driving plates 234. An air pad (not shown) is provided under the X-Y lower plate 235, so that the entire X-Y slider 203 can slide on the stage surface plate 200 in the X-Y direction.

Figure 7A:
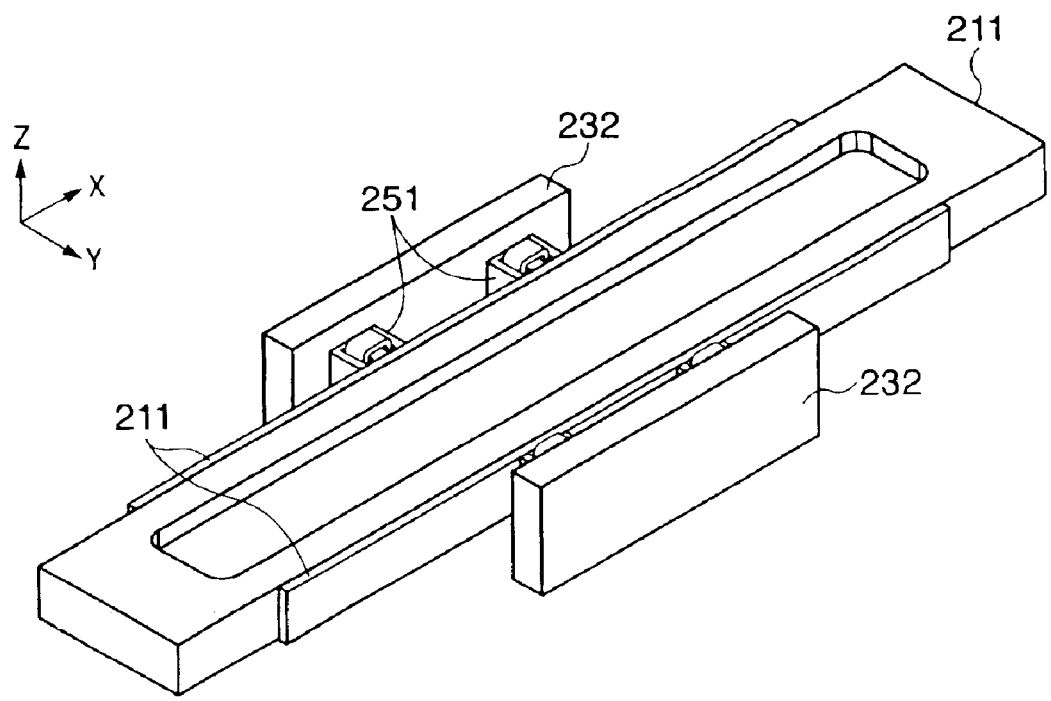
FIGS. 7A and 7B are detailed views of the periphery of Y electromagnets in the movement stage apparatus of the second embodiment.
Figure 7B:
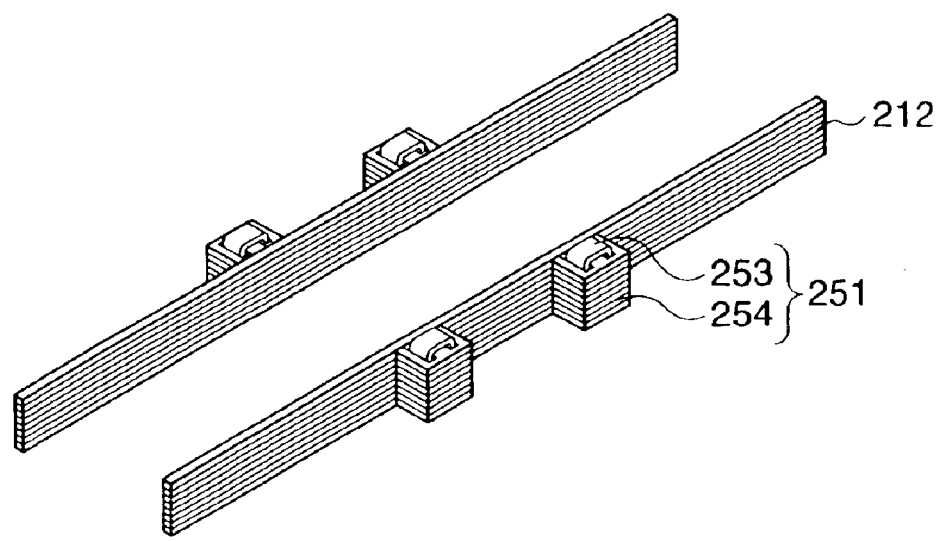

FIGS. 7A and 7B show the arrangement of the periphery of the Y bar 211. The Y attracting plates 212 are fixed to the two side surfaces of the Y bar 211. The two Y electromagnets 251 are fixed to each of the two Y driving plates 232 serving as part of the X-Y slider 203. Two Y electromagnets 251 face each Y attracting plate 212 in a noncontact manner. Each Y electromagnet 251 is formed of a coil 253 and E iron core 254.

When the position in the Y axis direction and rotation about the Z axis of the X-Y slider 203 and the position in the Y axis direction and rotation about the Z axis of the Y slider are measured and appropriate currents are supplied to the four Y electromagnets 251 in accordance with the measured amounts, the Y bar 211 and X-Y slider 203 can be kept in noncontact with each other. When the Y bar 211 is accelerated in the positive Y axis direction at an acceleration a, if currents are supplied in synchronism such that the two deep side Y electromagnets 251 generate a force corresponding to α× (mass of X-Y slider+mass of fine movement stage), then the "X-Y slider+fine movement stage" can be accelerated in the positive Y axis direction at the acceleration a through the Y attracting plates 212. Thus, the Y bar 211 and the "X-Y slider+fine movement stage" can operate almost in synchronism with each other. The force for accelerating the Y bar 211 is generated by the two sets of iron core Y linear motors 205 (to be described later) with reference to FIGS. 8A to 8C.

Similarly, when the Y bar is accelerated in the negative Y axis direction at an acceleration α, if currents are supplied in synchronism such that the two front side Y electromagnets 251 generate a force corresponding to αx (mass of X-Y slider+mass of fine movement stage), then the "X-Y slider+fine movement stage" can be accelerated in the negative Y axis direction at the acceleration α through the Y attracting plates 212. Thus, the Y bar 211 and the "X-Y slider+fine movement stage" can operate almost in synchronism with each other. The control for keeping the X-Y slider and Y bar 211 in noncontact with each other is performed during acceleration, as well, in a parallel manner.

The periphery of the X bar is the same as that of the Y bar. More specifically, the periphery of the X bar and that of the Y bar have the same arrangement. Only by changing the letters Y in the description concerning the periphery of the Y bar to letters X, the X bar can realize the same function as that described concerning the periphery of the Y bar 211.

Figure 8C:
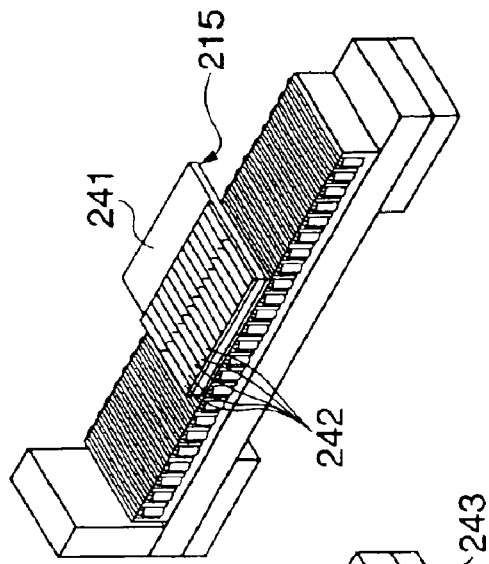
FIGS. 8A to 8C are views for explaining a linear motor in the movement stage apparatus of the second embodiment.
Figure 8B:
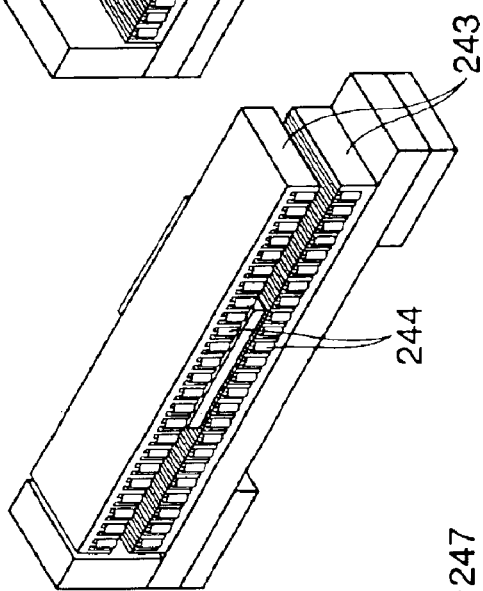
Figure 8A:
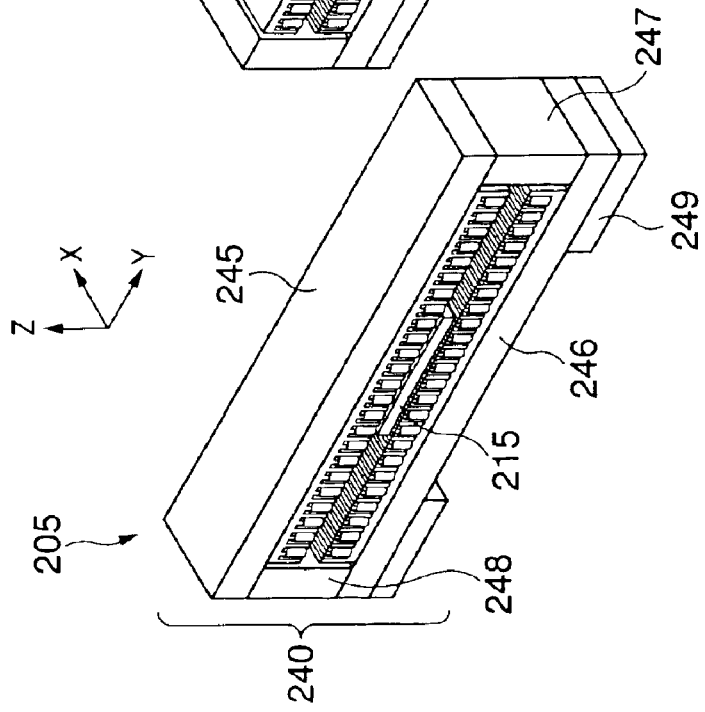

The Y linear motors and X linear motors for driving the Y slider and X slider will be described. The Y linear motors 205 will be described as an example. Each Y linear motor 205 has an arrangement as shown in FIGS. 8A to 8C. The movable element 215 of the Y linear motor 205 is formed of a middle plate 241, and fourteen permanent magnets 242 formed on the middle plate 241 and fourteen permanent magnets 242 formed under the middle plate 241. The permanent magnets 242 are magnetized in the Z direction and are arrayed such that their N and S poles are reversed between the adjacent electromagnets 242. The middle plate 241 is made of a magnetic body to transmit the magnetic fluxes of the permanent magnets 242 through it. The movable element 215 is fixed to the Y bar 21 1 through an attaching plate 214 (see FIG. 6).

The stator 240 is formed by arranging two units, obtained by inserting a plurality of coils 244 in comb-toothed iron cores 243, to clamp the movable element 215 from above and below in a noncontact manner, and fixing the two units with four reinforcing plates, i.e., upper, lower, front, and rear reinforcing plates 245, 246, 247, and 248. Legs 249 are provided under the lower reinforcing plate 246, and serve to fix the entire stator 240 to the stage surface plate 200.

FIGS. 8A to 8C show an eleven-shot, twelve-pole motor designed such that the total length of the eleven slots and the total length of the twelve poles of the magnets coincide with each other. The adjacent coils are connected in series or parallel to each other to form one phase. Regarding an electrical angle with reference to the period of the magnet, three different coil phases are provided, thus forming a so-called three-phase motor. Note that the in-phases include phases that are shifted by 180°.

The driving method is a so-called three-phase sine wave driving with which three-phase coils contributing to the thrust are selected in accordance with the positions of the permanent magnets 242 and sine wave currents are supplied to them such that the current vector and magnetic flux vector are perpendicular to each other. The iron core linear motor is characteristic in that it can generate a larger thrust than that generated by the coreless type linear motor described in the first embodiment, with the same heat generation. Furthermore, in the arrangement of FIGS. 8A to 8C, each movable element 215 is formed of only a magnet, while the stator 240 is formed of the coils and iron cores. Thus, when the total length of the comb teeth of the comb-toothed iron cores is increased to increase the amounts of coils and iron cores, a larger thrust can be generated. Even in this case, the mass of the movable element stays the same. Therefore, the thrust can be increased without increasing the transport mass.

In the above arrangement, when the X linear motors 204 and Y linear motors 205 are driven to accelerate the X slider 201 and Y slider 202, very large accelerating forces can be transmitted from the X bar 221 and Y bar 211 to the X-Y slider 203 because of the X electromagnets and the Y electromagnets 251. The X electromagnets and the Y electromagnets 251 are controlled, even during transmission of the accelerating forces, to keep the X-Y slider 203 and X slider 201 in noncontact with each other and the X-Y slider 203 and Y slider 202 in noncontact with each other. In other words, a large accelerating force can be transmitted to the large mass X-Y slider 203 loaded with the six-axis fine movement stage 360 while maintaining the noncontact state. High accuracy position control is achieved by the six-axis fine movement stage 360. Thus, both a fine pattern and high productivity can be obtained.

Finally, advantages obtained by the combination of the moving magnet iron core linear motors and the stage in a 2×2 matrix will be described. This stage is characteristic in that it need not transport the driving mechanism of any other driving shaft both in X driving and Y driving. Hence, the movable portion of the driving mechanism of a certain axis can be designed to be lightweight, while its stationary portion can be designed to be heavy. This is because, as a result of such a design, even when the stationary portion of a certain axis becomes heavy, the heavy stationary portion need not be transported by the driving system of the other axis. Conversely, in the first embodiment described above, as the X linear motor is loaded on the Y slider, when the stator of the X linear motor is made heavy, the accelerating force necessary in the Y driving system increases, which is not preferable. In the iron core linear motor shown in FIGS. 8A to 8C, its movable portion is made lightweight while its stationary portion is made heavy to obtain a large thrust. In the linear motor with the arrangement shown in FIGS. 8A to 8C, as described above, when the height of the comb teeth of the comb-toothed iron core is increased and the amount of coil to be wound on the comb teeth is increased, the thrust can be increased while maintaining constant the mass of the movable element. Although the mass of the stator increases accordingly, as the stator is not transported by the driving system of another axis, the increase in mass of the stator does not pose an issue.

Namely, when the stage in a 2×2 matrix and the moving magnet iron core linear motors arc combined, a large thrust can be applied to the Y and X sliders, and hence, the X-Y slider.

<Third Embodiment>

Figure 9:
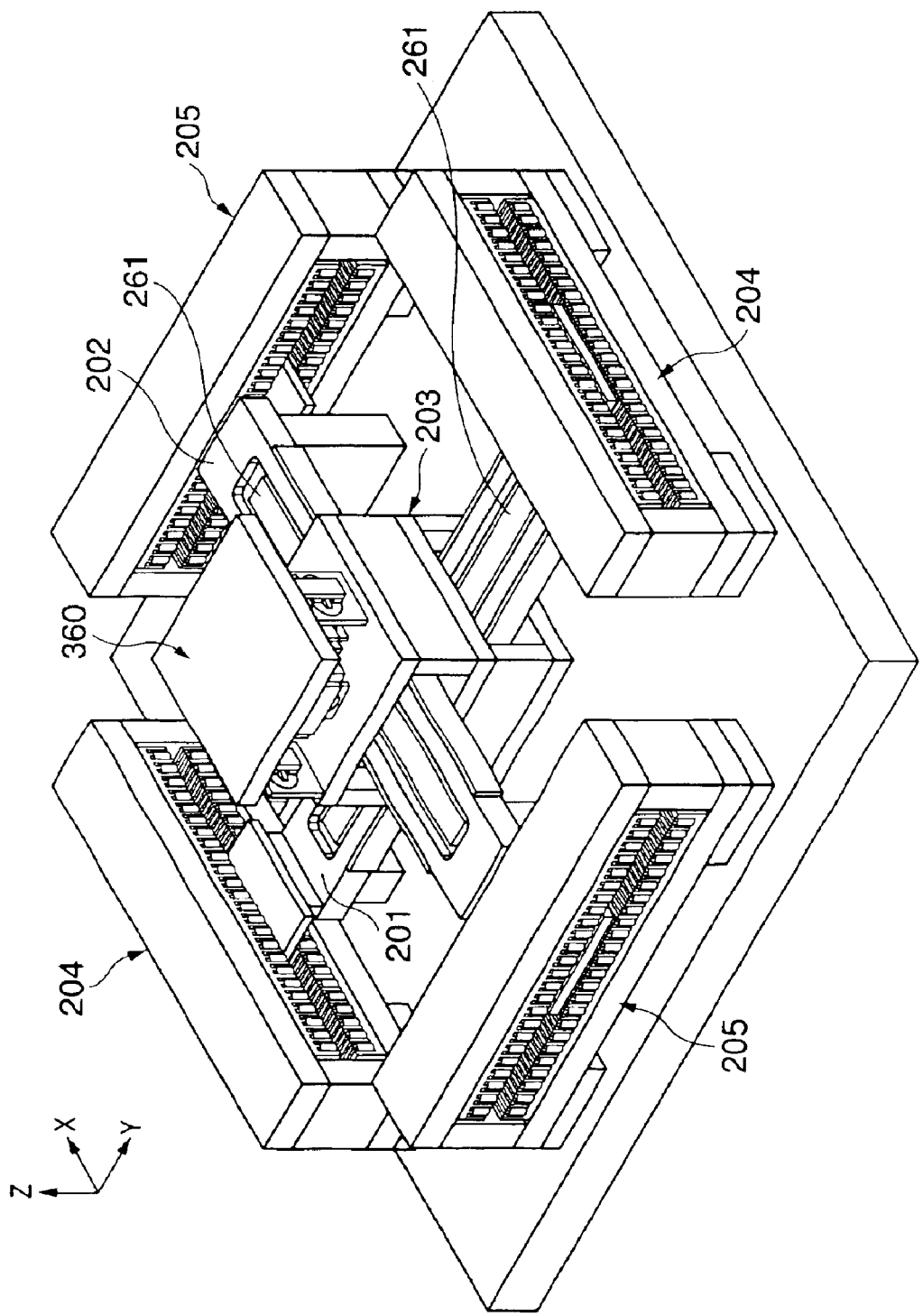
FIG. 9 is a view schematically showing a movement stage apparatus of the third embodiment.
Figure 10:
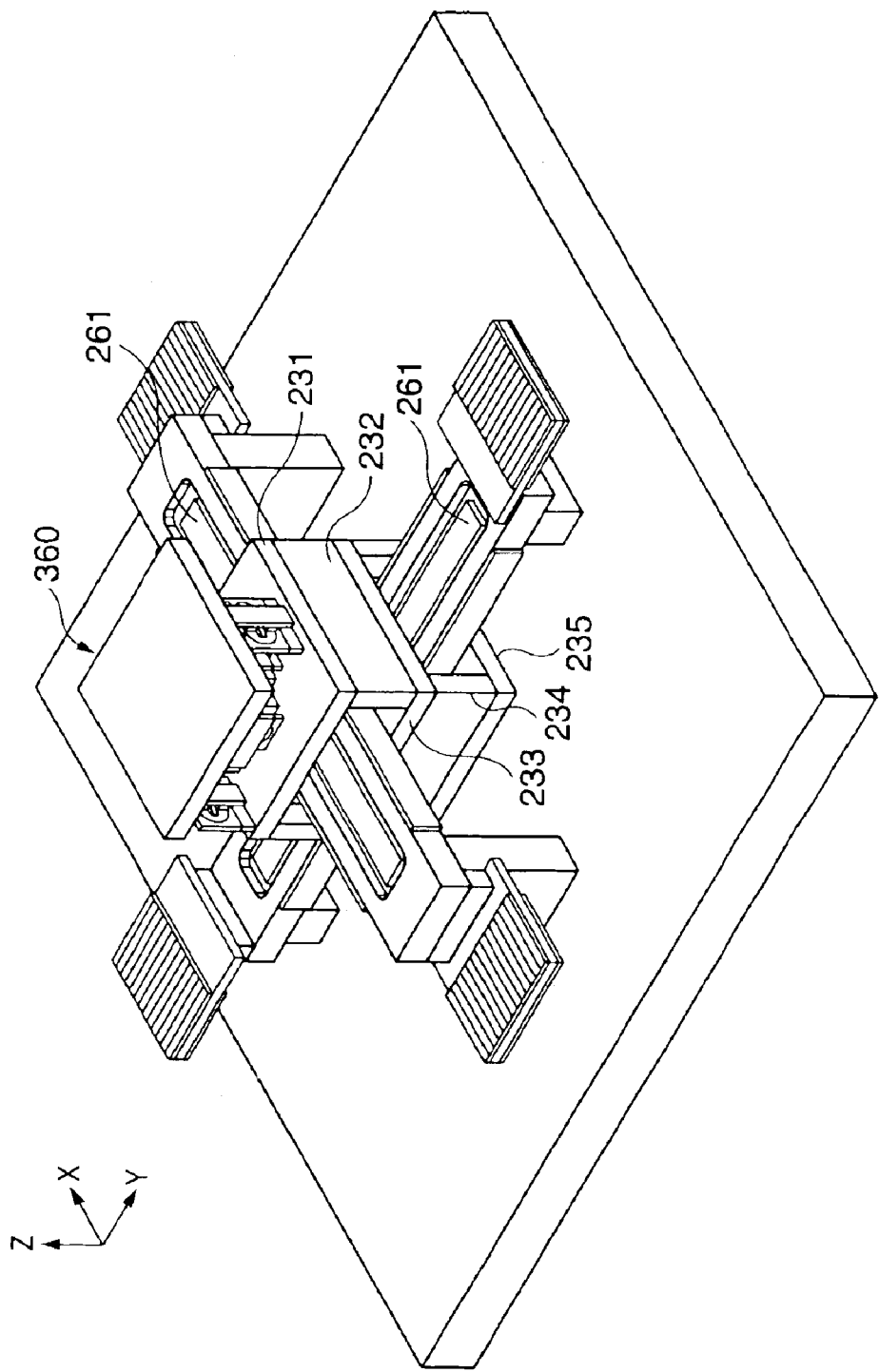
FIG. 10 is a partly omitted view of the movement stage apparatus according to the third embodiment.

The third embodiment will be described. FIGS. 9 and 10 show a stage apparatus according to the third embodiment.

The arrangement, function, and effect of the stage apparatus of the third embodiment are almost the same as those of the second embodiment. Namely, the basic arrangement of the stage is of a 2×2 matrix type, and is formed of an X slider 201, a Y slider 202, an X-Y slider 203, and a fine movement stage 360. To drive the X slider 201 and Y slider 202, moving magnet iron core linear motors (204, 205) are used. Electromagnets and attracting plates are formed between the X-Y slider 203 and X slider 201, and between the X-Y slider 203 and Y slider 202. When currents to the electromagnets are appropriately controlled, the X-Y slider 203 receives a large accelerating force from the X slider 201 and Y slider 202. Also, the X-Y slider 203 and X slider 201 are kept in noncontact with each other, and the X-Y slider 203 and Y slider 202 are kept in noncontact with each other. The combination of the stage in a 2×2 matrix and iron core moving magnet linear motors can generate a large accelerating force. These features are the same as those described in the second embodiment.

Figures 11A, 11B:
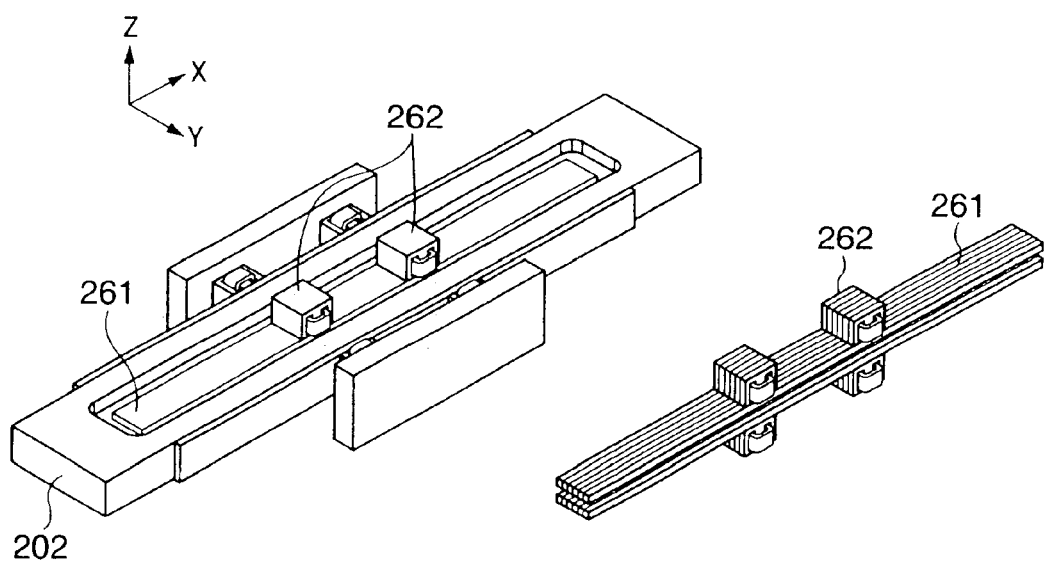
FIGS. 11A and 11B are detailed views of the periphery of Y electromagnets and Z electromagnets in the movement stage apparatus of the third embodiment.
Figure 12A:
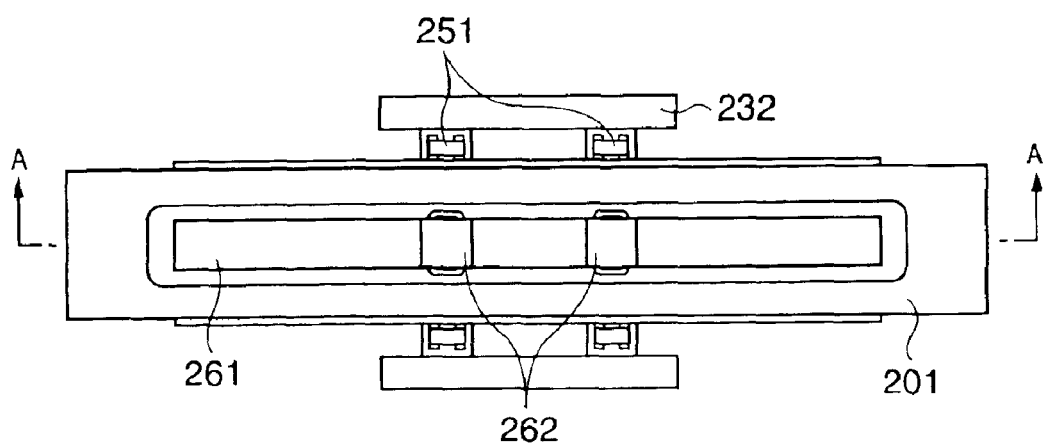
FIGS. 12A and 12B are detailed views of the periphery of the Y electromagnets and Z electromagnets in the movement stage apparatus of the third embodiment.
Figure 12B:
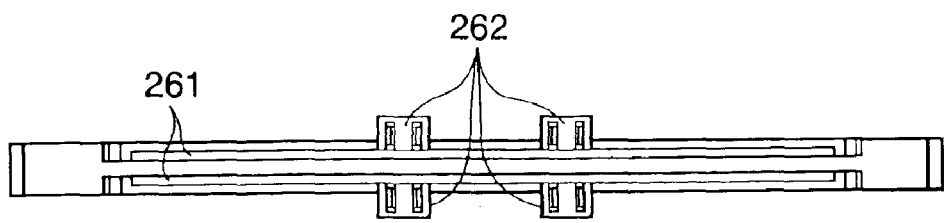

In the third embodiment, in addition to the above respects, Z attracting plates 261 and Z electromagnets 262 (FIGS. 11A and 11B) are provided around the X slider 201 and Y slider 202. The inclination of the X-Y slider 203 caused by a moment occurring when it is accelerated can be suppressed.

Although a Z electromagnet system as a new element is added, the periphery of the X slider and that of the Y slider have the same arrangement as that in the second embodiment. The periphery of the Y slider will be described hereinafter.

FIGS. 11A and 11B, and FIGS. 12A and 12B, show the arrangement of the periphery of a Y bar 202. Except for the Z electromagnet system, this arrangement is the same as that of the periphery of the Y bar of the second embodiment shown in FIGS. 7A and 7B, and the operation and effect of this arrangement except for the Z electromagnetic system is the same as those of the second embodiment. In the third embodiment, in addition to the arrangement of the second embodiment, the Z attracting plates 261 are provided on and below the Y bar 202. Two Z electromagnets 262 are provided to face each Z attracting plate 261 in a noncontact manner. The two upper Z electromagnets 262 are fixed to an X-Y upper plate 231, and the two lower Z electromagnets 262 are fixed to an X-Y middle plate 233.

An X bar 201 is provided with Z attracting plates and Z electromagnets in the same manner. Regarding the periphery of the X bar 201, the two upper Z electromagnets are the X-Y middle plate 233, and the two lower Z electromagnets are fixed to an X-Y lower plate 235.

The operation of the Z electromagnet system provided to the Y bar 202 will be described. The X bar 201 has the same operation as this.

Figure 13:
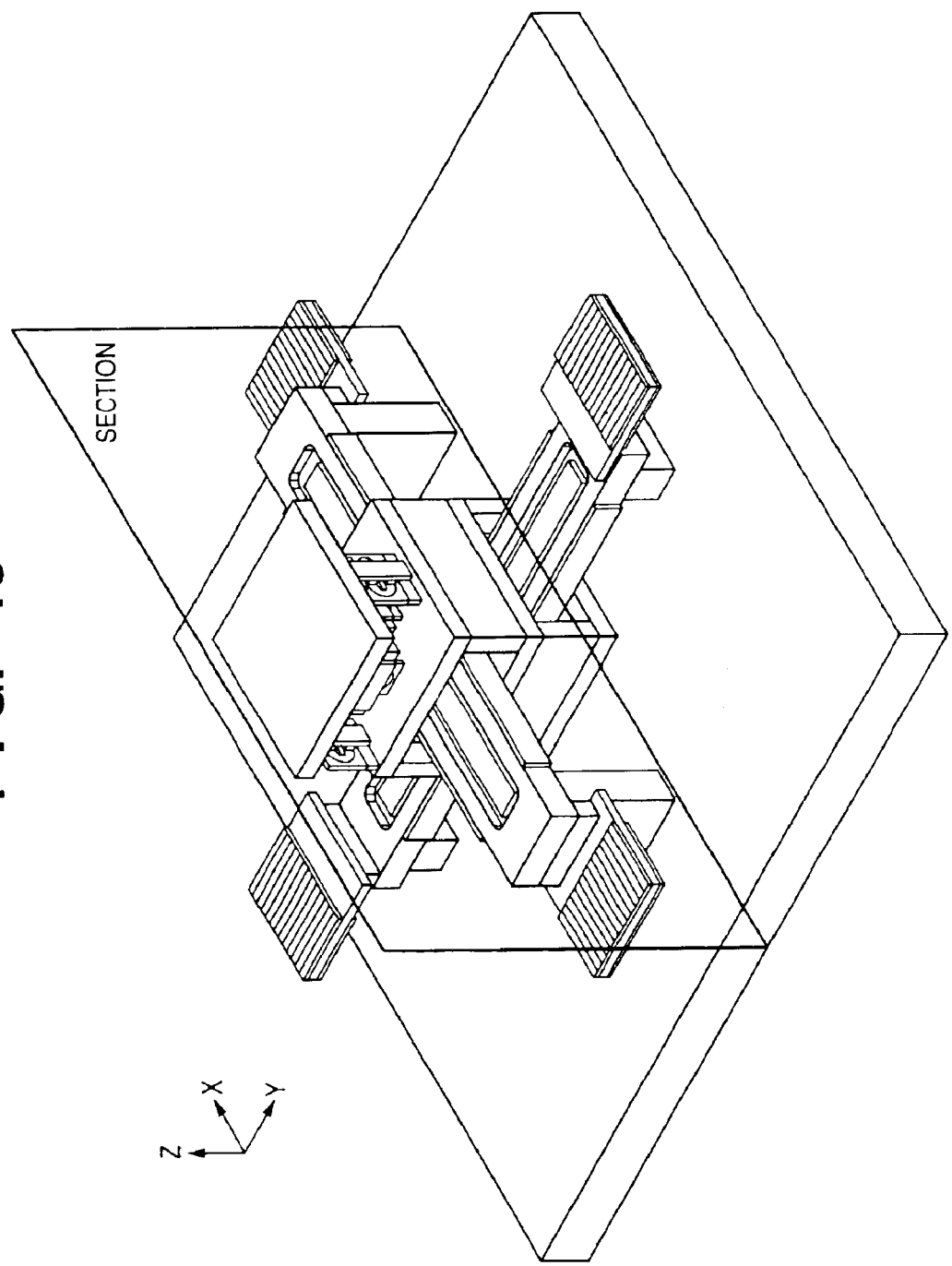
FIG. 13 is a view for explaining the operation of the Z electromagnets in the movement stage apparatus of the third embodiment.
Figure 14A:
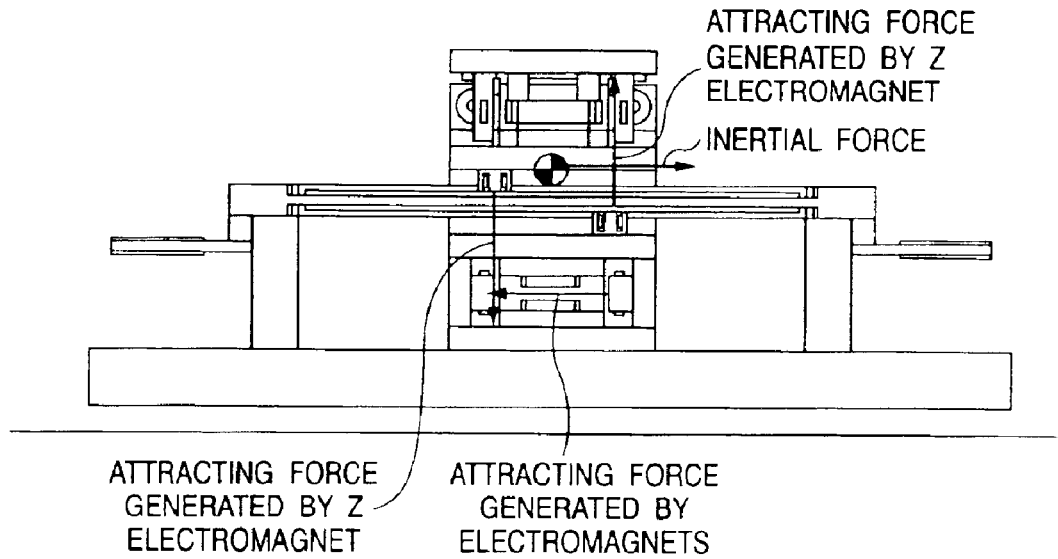
FIGS. 14A and 14B are views for explaining the operation of the Z electromagnets in the movement stage apparatus of the third embodiment.
Figure 14B:
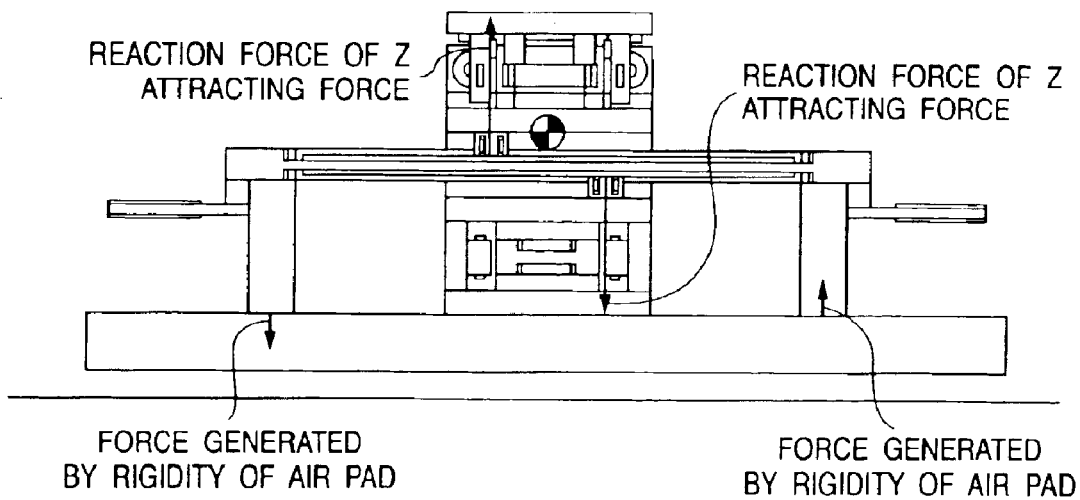

FIG. 13 shows the sections of the X slider, Y slider, X-Y slider, and fine movement stage, and FIGS. 14A and 14B explain the operation of the Z electromagnet system on these sections.

FIG. 14A shows a force that acts on an X-Y slider system when a thrust is supplied to the X linear motor to accelerate the X-Y slider and fine movement stage in the negative X direction through an X slider system. FIG. 14B shows a force that acts on the Y slider system at this time.

To apply an accelerating force in the negative X direction to the X-Y slider, the X electromagnets arranged on the positive X side may generate an attracting force equivalent to the accelerating force, as described above. The line of action of the attracting force is shifted from the barycenter of the "X-Y slider+fine movement stage" as a whole. Thus, during acceleration, the inertial force that acts on the "X-Y slider+fine movement stage" as a whole and the line of action of the attracting force does not coincide, and a moment is generated for the X-Y slider. Hence, appropriate currents are supplied to, of the four Z electromagnets, two located at the diagonal positions, so that the moment caused by the attracting force and inertial force is canceled. Therefore, as a whole, no moment is generated in the X-Y slider, and the posture of the X-Y slider does not incline.

In a case where the moment is not canceled by means of the Z electromagnet system, the moment acting on the X-Y slider would be matched with the air pad provided under the X-Y lower plate. The air pad, however, cannot have a large span, and the air pad portion must generate a load substantially equivalent to the accelerating force. The air pad generates a load per unit area of about 1 kgf/cm², as described above, and consequently, a load substantially equivalent to the accelerating force cannot be generated. Therefore, the lower portion of the X-Y slider may cause contact. In order to avoid this, acceleration must be limited. Hence, to obtain a larger acceleration, the moment must be canceled by the Z electromagnets. FIG. 14A shows this state.

FIG. 14B is a view explaining where the moment received by the Z electromagnets is transmitted. As the attracting force of the Z electromagnets is transmitted to the two Z attracting plates of the Y slider, the moment is transmitted to the Y slider. The Y slider matches the moment transmitted from the Z electromagnets with the load generated by the air pads provided under Y legs. As shown in FIG. 14B, the span under the Y legs can be about several times the span of the two Z electromagnets, and accordingly, the load that the air pads under the Y legs should generate can be a small fraction of the accelerating force. In other words, even an air pad that generates a small load can match the moment generated during acceleration. This refers to the situation of acceleration in the X direction. The same applies to acceleration in the Y direction. Note that the shift between the line of action of the attracting force of the Z electromagnets and the barycenter of the "X-Y slider+fine movement stage" as a whole is considerably smaller than the shift between the line of action of the attracting force of the X electromagnets and the barycenter of the "X-Y slider +fine movement stage" as a whole. Hence, the load that the air pads should generate can be small.

As described above, in the third embodiment, in addition to the effect of the second embodiment, an effect can be obtained that the inclination in the pitching direction of slider can be substantially decreased to zero.

As has been described above, according to the present invention, there is provided a noncontact guide that can accelerate a large transport mass movable body on which a fine movement stage is loaded.

As many apparently widely different embodiments of the present invention can be made without departing from the spirit and scope thereof, it is to be understood that the invention is not limited to the specific embodiments thereof except as defined in the claims.

What is claimed is:

1. A stage apparatus comprising:
   a first-direction guide which extends in a first direction and can move in a second direction perpendicular to the first direction;
   a first driving mechanism which moves said first-direction guide in the second direction;
   a movable body which can be guided by said first-direction guide to move in the first direction; and
   first electromagnetic force generating means which generates an electromagnetic force in the second direction between said movable body and said first-direction guide in synchronism with acceleration of said first-direction guide in the second direction, so as to keep said movable body and said first-direction guide in noncontact with each other.

2. The apparatus according to claim 1, wherein said first electromagnetic force generating means includes an electromagnet provided to said movable body to oppose a guide surface of said first-direction guide, and an attracting plate provided along the guide surface.

3. The apparatus according to claim 1, further comprising a fine movement stage which is loaded on said movable body and can control displacement at least in the second direction.

4. The apparatus according to claim 3, wherein said fine movement stage is controlled by the Lorentz force in six-axis directions including the first direction, the second direction, a third direction perpendicular to the first and second directions, and rotations about axes of the first to third directions.

5. The apparatus according to claim 1, further comprising a second driving mechanism which moves said movable body in the first direction with a linear motor provided on said first direction guide.

6. The apparatus according to claim 1, further comprising
a second-direction guide which extends in the second direction and can move in the first direction; and
a second driving mechanism which moves said second-direction guide in the first direction,
wherein said movable body is provided at an intersection of said first-and second-direction guides and can be guided in the first and second directions to move in the first and second directions, and
wherein said first electromagnetic force generating means further generates an electromagnetic force in the first direction between said movable body and said second-direction guide in synchronism with acceleration of said second-direction guide in the first direction, so as to keep said movable body and said second-direction guide in noncontact with each other.

7. The apparatus according to claim 6, further comprising second electromagnetic force generating means for generating an electromagnetic force in a third direction perpendicular to a plane including the first and second directions, either between said first-direction guide and said movable body or between said second-direction guide and said movable body.

8. The apparatus according to claim 6, wherein said first and second driving mechanisms comprise iron core moving magnet linear motors.

9. The apparatus according to claim 1, further comprising:
a first-direction guide position measuring unit which measures position of said first-direction guide in the second direction; and
a movable body position measuring unit which measures position of said movable body in the second direction.

10. The apparatus according to claim 9, wherein said first-direction guide position measuring unit measures a rotational component of said first-direction guide, and said movable body position measuring unit measures a rotational component of said movable body.

11. A method of controlling a stage apparatus, said method comprising:
a driving step of moving a first-direction guide, which extends in a first direction and can move in a second direction perpendicular to the first direction, in the second direction;
a first control step of controlling at least a pair of electromagnets, which generate electromagnetic forces in opposite directions along the second direction between a movable body, which can be guided in the first direction guide to move in the first direction, and the first direction guide, to keep the movable body and the first-direction guide in noncontact with each other; and
a second control step of controlling driving of the electromagnets, in synchronism with acceleration of the first-direction guide in the second direction by the driving step, to apply an accelerating force in the second direction to the movable body.

* * * * *

UNITED STATES PATENT AND TRADEMARK OFFICE
CERTIFICATE OF CORRECTION

PATENT NO. : 6,946,757 B2
DATED : September 20, 2005
INVENTOR(S) : Nobushige Korenaga It is certified that error appears in the above-identified patent and that said Letters Patent is hereby corrected as shown below:

Title page,
Item [56], References Cited, U.S. PATENT DOCUMENTS,
"5,841,250   A         11/1998   Korenage et al. ……………..318/135" should read
-- 5,841,250 A         11/1998   Korenaga et al. ………….. 318/135 --.

Column 2,
Line 66, "$m_1$, is" should read -- $m_1$ is --.

Figure 18:
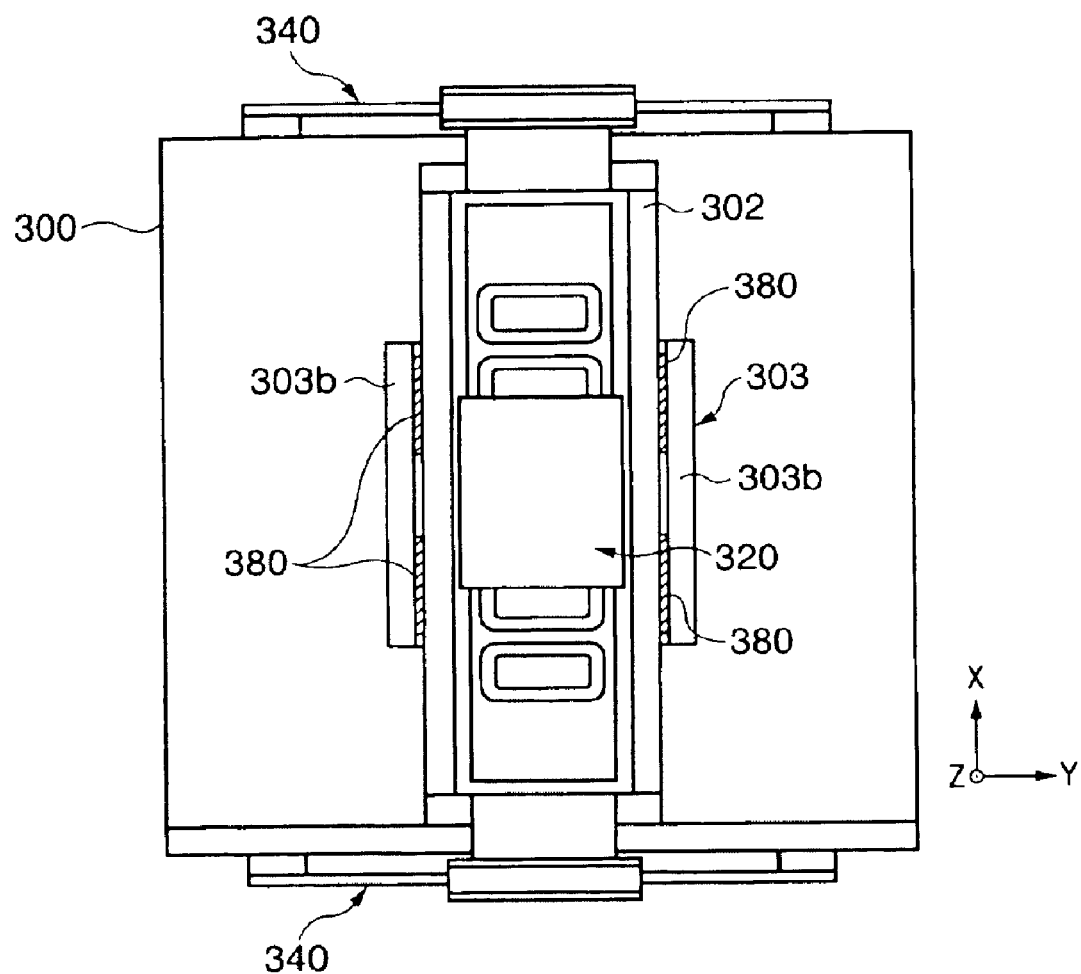
FIGS. 18 is a view for explaining air pads employed in the general movable stage apparatus.

Column 4,
Line 47, "FIGS. 18" should read -- FIG. 18 --.

Column 8,
Lines 60 and 65, "acceleration a," should read -- acceleration α, --.

Column 9,
Line 35, "Y bar 21 1," should read -- Y bar 211, --.

Column 10,
Line 49, "arc" should read -- are --.

Column 12,
Line 32, "slider" should read -- the X-Y slider --.

Column 13,
Line 11, "comprising" should read -- comprising: --.

UNITED STATES PATENT AND TRADEMARK OFFICE
CERTIFICATE OF CORRECTION

PATENT NO. : 6,946,757 B2
DATED : September 20, 2005
INVENTOR(S) : Nobushige Korenaga It is certified that error appears in the above-identified patent and that said Letters Patent is hereby corrected as shown below:

Column 14,
Lines 24 and 25, "first direction" should read -- first-direction --.

Signed and Sealed this

Twenty-first Day of February, 2006

JON W. DUDAS
*Director of the United States Patent and Trademark Office*